(12) United States Patent
Soneda et al.

(10) Patent No.: US 9,244,269 B2
(45) Date of Patent: Jan. 26, 2016

(54) MICRO MOVABLE DEVICE AND OPTICAL SWITCHING APPARATUS

(75) Inventors: Hiromitsu Soneda, Kawasaki (JP); Tsuyoshi Matsumoto, Kawasaki (JP); Yoshihiro Mizuno, Kawasaki (JP); Norinao Kouma, Kawasaki (JP); Hisao Okuda, Kawasaki (JP); Osamu Tsuboi, Kawasaki (JP)

(73) Assignee: DRNC Holdings, Inc., Wilmington, DE (US)

( * ) Notice: Subject to any disclaimer, the term of this patent is extended or adjusted under 35 U.S.C. 154(b) by 1587 days.

(21) Appl. No.: 12/573,393

(22) Filed: Oct. 5, 2009

(65) Prior Publication Data

US 2010/0092130 A1 Apr. 15, 2010

(30) Foreign Application Priority Data

Oct. 10, 2008 (JP) .................................. 2008-263658

(51) Int. Cl.
*G02B 6/42* (2006.01)
*G02B 26/08* (2006.01)
*B81C 3/00* (2006.01)
*G01D 5/28* (2006.01)
*G02B 6/35* (2006.01)
*H02N 1/00* (2006.01)

(52) U.S. Cl.
CPC ............ *G02B 26/0841* (2013.01); *B81C 3/001* (2013.01); *G01D 5/285* (2013.01); *G02B 6/3518* (2013.01); *H02N 1/006* (2013.01); *B81B 2201/042* (2013.01); *B81B 2203/0136* (2013.01); *B81B 2203/058* (2013.01); *G02B 6/356* (2013.01); *G02B 6/357* (2013.01); *G02B 6/3556* (2013.01); *G02B 6/3584* (2013.01)

(58) Field of Classification Search
USPC ............................................... 385/18
See application file for complete search history.

(56) References Cited

U.S. PATENT DOCUMENTS

| | | | |
|---|---|---|---|
| 6,442,307 B1 | 8/2002 | Carr et al. | |
| 6,448,624 B1 | 9/2002 | Ishio et al. | |
| 6,590,710 B2 * | 7/2003 | Hara et al. | 359/579 |
| 6,798,942 B2 * | 9/2004 | Freeman et al. | 385/18 |
| 6,806,992 B2 | 10/2004 | Soneda et al. | |
| 6,906,849 B1 | 6/2005 | Mi et al. | |
| 2002/0054422 A1 | 5/2002 | Carr et al. | |
| 2005/0007933 A1 * | 1/2005 | Yoda | 369/112.22 |
| 2005/0063038 A1 | 3/2005 | Filhol | |

(Continued)

FOREIGN PATENT DOCUMENTS

| | | |
|---|---|---|
| JP | 9-219351 A | 8/1997 |
| JP | 10-123167 A | 5/1998 |
| JP | 2003-19530 A | 1/2003 |
| JP | 2003-344785 A | 12/2003 |

(Continued)

*Primary Examiner* — Tina Wong
(74) *Attorney, Agent, or Firm* — Baker & Hostetler LLP

(57) ABSTRACT

A micro movable device includes: a micro movable substrate in which a micro movable unit is formed, the micro movable unit including a frame, a movable part, and a coupling part for coupling the frame and the movable part to define an axial center of rotation of the movable part; a supporting substrate; and a reinforced fixed part provided between the frame and the supporting substrate, and including a first spacer that joins the frame to the supporting substrate and an adhesive part that covers the first spacer and joins the frame to the supporting substrate, wherein the frame includes a first area facing the movable part in a direction of extent of the axial center, and a second area different from the first area, and the reinforced fixed part is bonded to the second area of the frame.

13 Claims, 28 Drawing Sheets

(56) References Cited

U.S. PATENT DOCUMENTS

| | | |
|---|---|---|
| 2006/0008200 A1* | 1/2006 | Nakamura et al. ............. 385/15 |
| 2006/0030074 A1 | 2/2006 | Mund et al. |
| 2008/0122117 A1 | 5/2008 | Pendse |
| 2009/0243006 A1 | 10/2009 | Takahashi et al. |
| 2010/0085623 A1 | 4/2010 | Matsumoto et al. |

FOREIGN PATENT DOCUMENTS

| | | |
|---|---|---|
| JP | 2004-341364 A | 12/2004 |
| JP | 2006-72252 A | 3/2006 |
| JP | 2006-251829 A | 9/2006 |
| JP | 2008-261653 | 10/2008 |

* cited by examiner

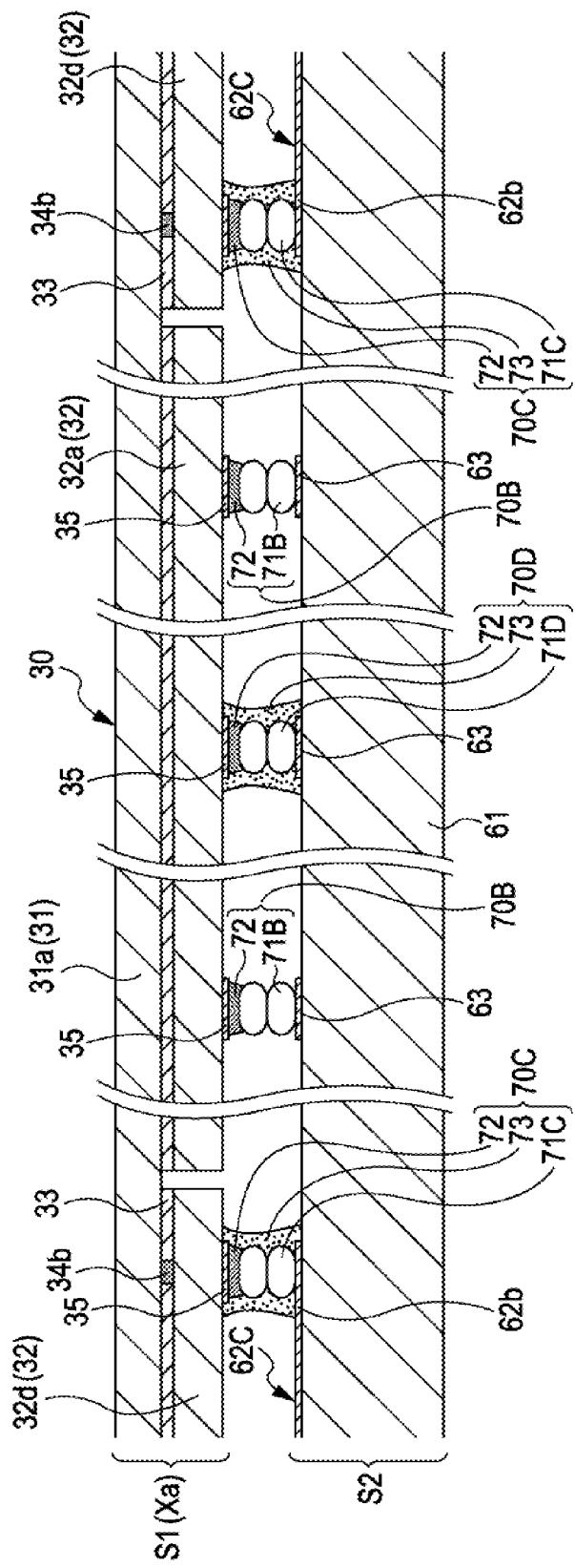

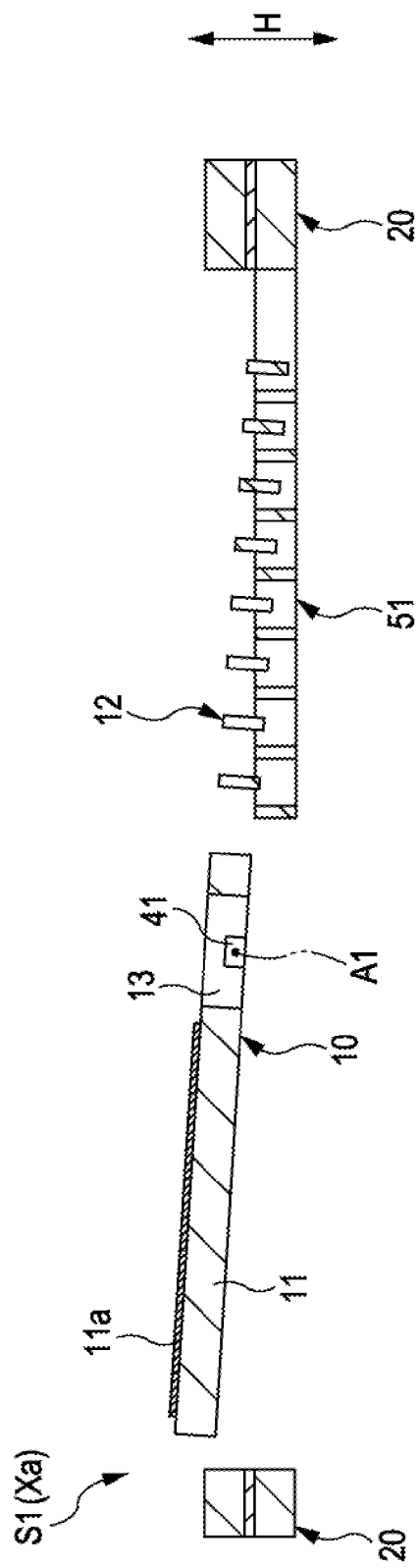

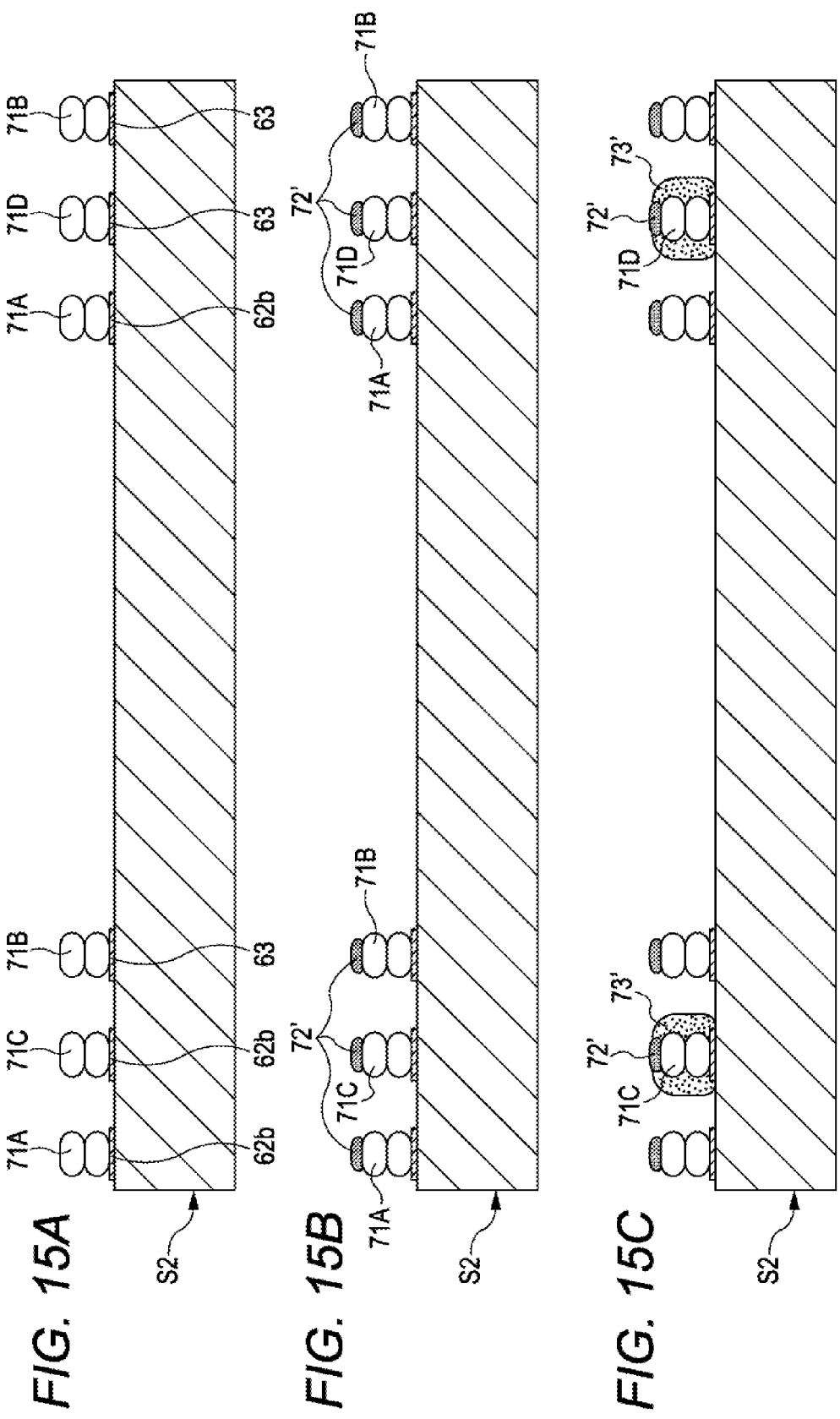

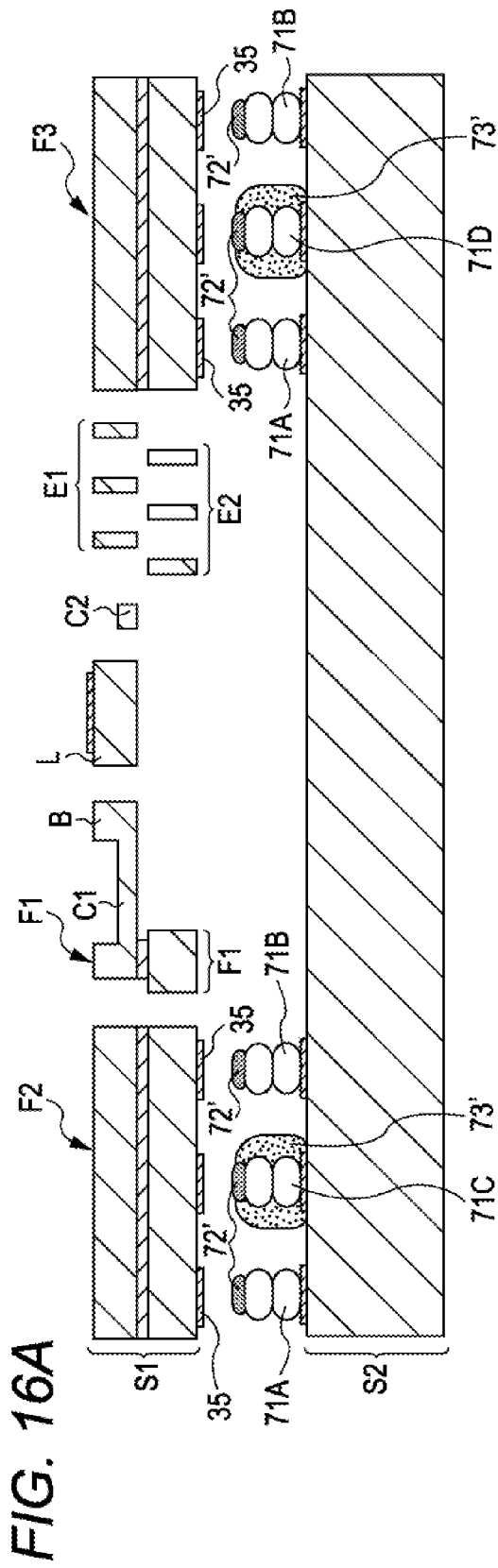

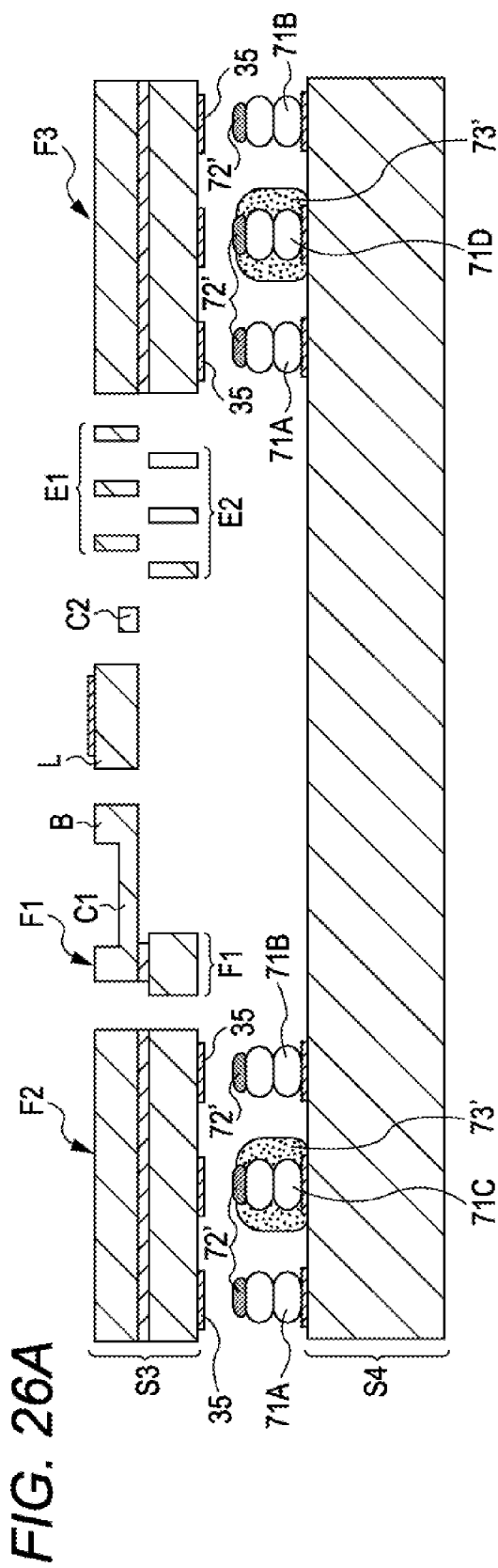
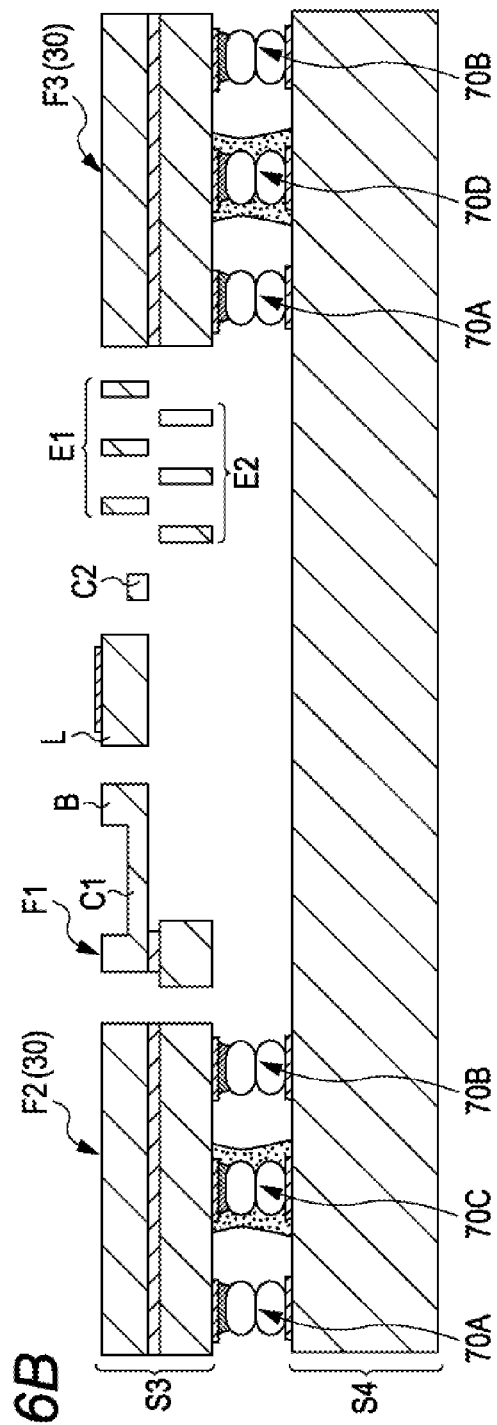
FIG. 26A
FIG. 26B

MICRO MOVABLE DEVICE AND OPTICAL SWITCHING APPARATUS

CROSS-REFERENCE TO RELATED APPLICATION

This application is based upon and claims the benefit of priority of the prior Japanese Patent Application No. 2008-263658, filed on Oct. 10, 2008, the entire contents of which are incorporated herein by reference.

FIELD

The embodiments discussed herein are related to a micro movable device including a minute movable part and an optical switching apparatus including a micro mirror device.

BACKGROUND

In recent years, devices having a microstructure formed by micro-machining technology have been applied in various kinds of technological fields. Such devices include, for example, a micro movable device having a microscopic movable part such as a micro-mirror device, angular velocity sensor, and acceleration sensor. The micro-mirror device is used in the field of, for example, optical communication technology or optical disk technology as a device performing an optical reflection function. The angular velocity sensor and acceleration sensor are used, for example, for a vibration preventing function of video cameras and mobile phones with cameras, car navigation system, air bag release timing system, posture control system of cars, robots and the like. Japanese Patent Application Laid-Open Nos. 2003-19530, 2004-341364, and 2006-72252 disclose such micro movable devices.

FIG. 29 to FIG. 32 illustrates a micro movable device X3, which is an example of a conventional micro movable device. FIG. 29 is a plan view of the micro movable device X3. FIG. 30 is a plan view partially illustrating the micro movable device X3. FIG. 31 and FIG. 32 are sectional views along a line XXXI-XXXI and a line XXXII-XXXII in FIG. 29 respectively.

The micro movable device X3 includes a micro movable substrate S5, a wiring substrate S6, a spacer 220, and an adhesive part 230.

The micro movable substrate S5 has a micro movable unit Xb formed thereon. The micro movable unit Xb includes a movable part 201, a frame 202 around the movable part 201, and a pair of connecting parts 203 connecting the movable part 201 and the frame 202. The pair of connecting parts 203 defines an axial center A3 of rotational displacement of the movable part 201. The micro movable substrate S5 has a conduction path (not illustrated) leading to each part such as the movable part 201 and the frame 202 provided therein.

A wiring pattern 210 is formed on the surface of the wiring substrate S6. The wiring pattern 210 includes pad parts 211 and 212. The pad part 211 is an external connection terminal for the micro movable device X3.

As illustrated in FIG. 31, the spacer 220 includes a bump part 221 and a conductive adhesive part 222. The spacer 220 is provided between the frame 202 of the micro movable substrate S5 and the wiring substrate S6. The bump part 221 is pressure-welded to the pad part 212 of the wiring pattern 210 in the wiring substrate S6. The micro movable substrate S5 is bonded to a pad part 202a provided on the surface of the frame 202 via the conductive adhesive part 222. The spacer 220 described above electrically connects the micro movable substrate S5 and the wiring substrate S6. The spacer 220 constitutes a portion of the conduction path from the pad part 211 of the wiring pattern 210 of the wiring substrate S6 to a specific region in the micro movable unit Xb of the micro movable substrate S5.

The adhesive part 230 is an adhesive for fixing the substrates. As illustrated in FIG. 31 and FIG. 32, the adhesive part 230 is provided between the frame 202 of the micro movable substrate S5 and the wiring substrate S6. By providing the adhesive part 230, fixing strength between the micro movable substrate S5 and the wiring substrate S6 is increased.

When the micro movable device X3 is applied to a micro mirror device, a mirror surface 201a is provided on the movable part 201. Further, an actuator (not illustrated) that generates a driving force (electrostatic attraction) to cause a rotational displacement of the movable part 201 around the axial center A3 is provided in the micro movable device X3. The movable part 201 is rotationally displaced around the axial center A3 up to an angle at which electrostatic attraction generated by the actuator and the total torsional resistance of each of the connecting parts 203 are balanced by the actuator being operated. When the driving force of the actuator disappears, the movable part 201 is brought back to the position in a natural state by the restoring force of the connecting parts 203. The reflecting direction of a light signal reflected by the mirror surface 201a provided on the movable part 201 is shifted by such a rocking drive of the movable part 201.

When, on the other hand, the micro movable device X3 is applied to an acceleration sensor, for example, a capacitor electrode for detection (not illustrated) is provided in each of the movable part 201 and the frame 202. The capacitor electrodes for detection are arranged facing each other. In this case, the electrostatic capacity of the capacitor changes in accordance with the rotational displacement around the axial center A3 of the movable part 201. When acceleration acts on the movable part 201, the movable part 201 is rotationally displaced around the axial center A3. Accordingly, the electrostatic capacity between the capacitor electrodes for detection changes. Based on the change in electrostatic capacity, the rotational displacement of the movable part 201 is detected. Based on a detection result of the rotational displacement of the movable part 201, acceleration acting on the micro movable device X3 or the movable part 201 is derived.

In a micro movable device in which a movable part and a frame are connected by connecting parts, a spring constant of the connecting parts affects mechanical characteristics of a device. Thus, in the conventional micro movable device X3, the spring constant of the connecting parts 203 is more likely to vary. Accordingly, mechanical characteristics such as a resonance frequency of the movable part 201 are more likely to vary.

In a manufacturing process of the micro movable device X3, first the bump part 221 is pressure-welded onto the pad part 212 in the wiring substrate S6. Then, a conductive adhesive which later becomes the conductive adhesive part 222 is supplied to a top part of the bump part 221. On the other hand, an adhesive for fixing the substrates to be the adhesive part 230 later is applied onto the wiring substrate S6. After the conductive adhesive and adhesive for fixing the substrates are applied, the micro movable substrate S5 and the wiring substrate S6 are joined via the bump part 221, the adhesive for fixing the substrates, and the like.

When the micro movable substrate S5 and the wiring substrate S6 are joined, the adhesive part 230 is formed by the hardening of the adhesive for fixing the substrates. When hardened, the adhesive for fixing the substrates contracts, for example, in directions illustrated by thick arrows in FIG. 31 and FIG. 32. Thus, the portion of the frame 202 of the micro movable substrate S5 where the adhesive part 230 is bonded is placed under a strong stress. If the frame 202 is deformed due to the stress, a stress also acts on the connecting parts 203. For example, a tensile stress acts on the connecting parts 203 in an arrow D direction illustrated in FIG. 32. Thus, the spring constant of the connecting parts 203 is different before and after the micro movable substrate S5 and the wiring substrate S6 are joined. That is, the spring constant of the connecting parts 203 varies.

The spring constant of the connecting parts 203 also varies due to a temperature change even after the micro movable substrate S5 and the wiring substrate S6 are joined. The adhesive part 230 undergoes a greater change in volume (expansion or contraction) due to a temperature change than, for example, the bump part 221 of the spacer 220. This is because a stress acts on the connecting parts 203 after the frame 202 is deformed due to the change in volume.

In the conventional micro movable device X3, as described above, the spring constant of the connecting parts 203 is more likely to vary. Variations of the spring constant of the connecting parts 203 may cause mechanical characteristics such as the resonance frequency of the movable part 201 to vary. Variations in mechanical characteristics of a device are not desirable because such variations frequently arise as degradation in device performance.

SUMMARY

A micro movable device includes: a micro movable substrate in which a micro movable unit is formed, the micro movable unit including a frame, a movable part, and a coupling part for coupling the frame and the movable part to define an axial center of rotation of the movable part; a supporting substrate; and a reinforced fixed part provided between the frame and the supporting substrate, and including a first spacer that joins the frame to the supporting substrate and an adhesive part that covers the first spacer and joins the frame to the supporting substrate, wherein the frame includes a first area facing the movable part in a direction of extent of the axial center and a second area different from the first area, and the reinforced fixed part is bonded to the second area of the frame.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 11 is a sectional view along a line XI-XI in FIG. 1;

FIG. 12 is a sectional view along the line IV-IV in FIG. 1 while being driven;

FIGS. 15A-15C are diagrams illustrating manufacturing processes of the micro movable device illustrated in FIG. 1;

FIGS. 16A-16B are diagrams illustrating manufacturing processes of the micro movable device illustrated in FIG. 1;

FIGS. 26A-26B are diagrams illustrating manufacturing processes of the micro movable device illustrated in FIG. 20;

DESCRIPTION OF EMBODIMENTS

Figure 1:
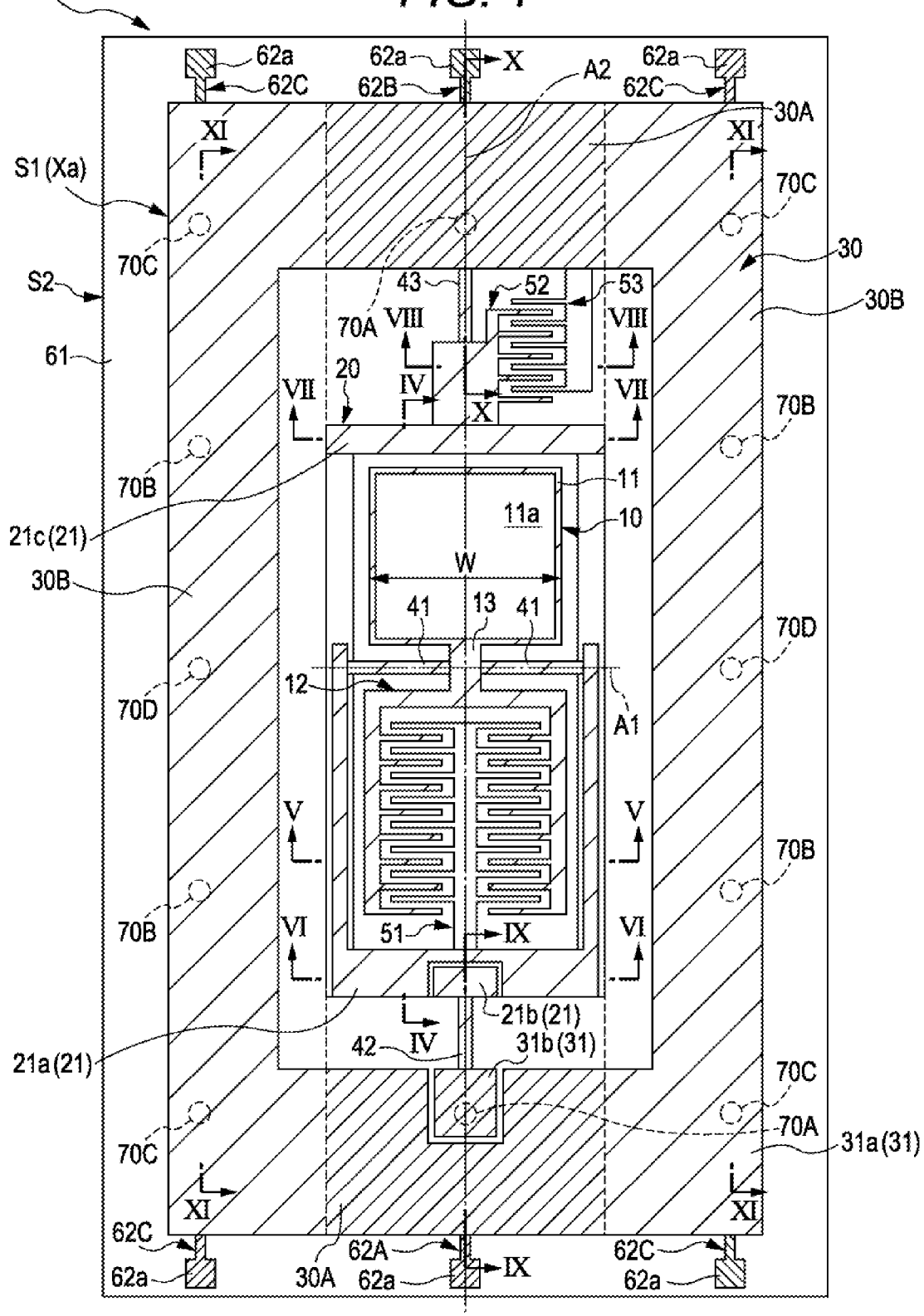
FIG. 1 is a plan view of a micro movable device according to a first embodiment.
Figure 2:
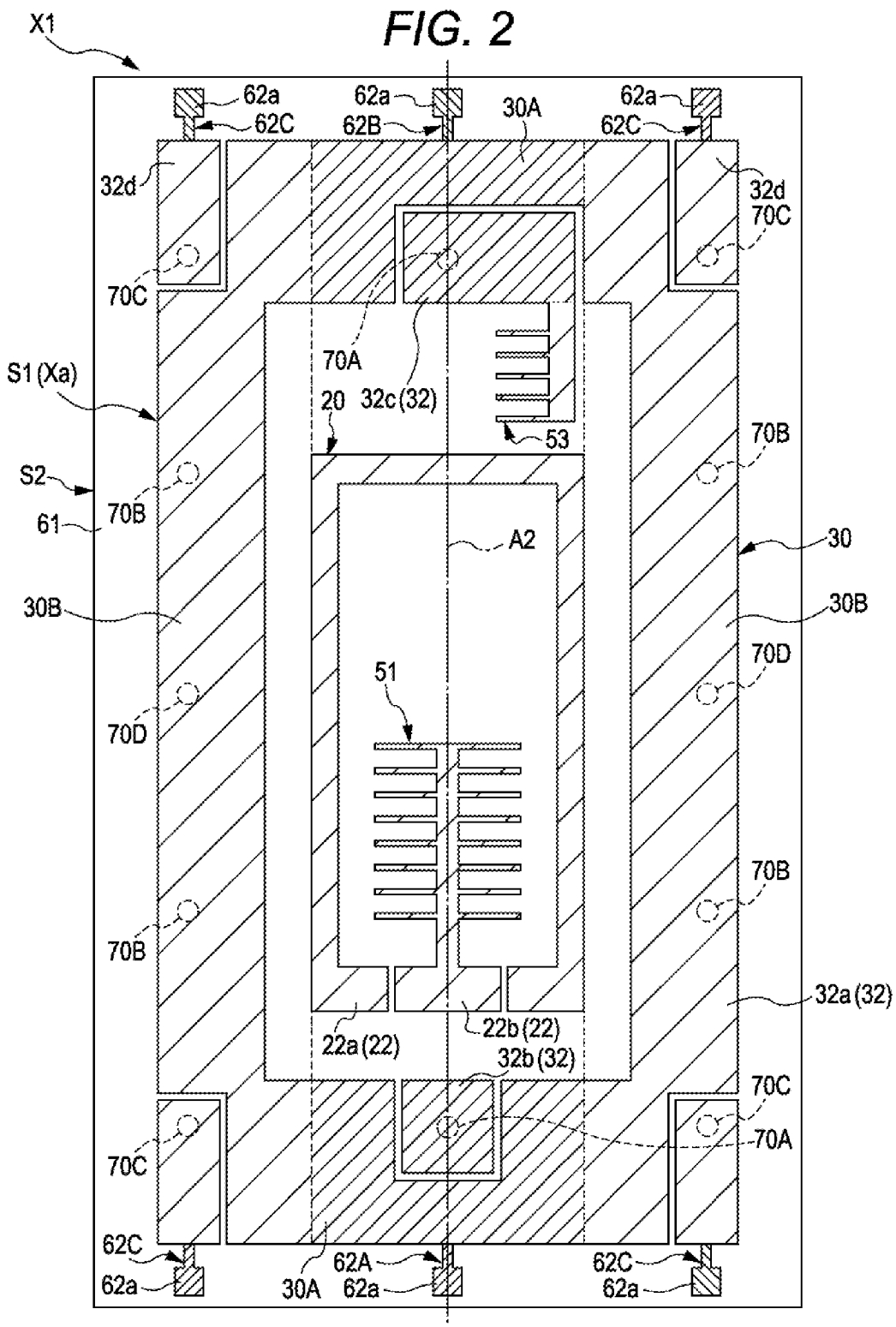
FIG. 2 is a plan view partially illustrating the micro movable device illustrated in FIG. 1.
Figure 3:
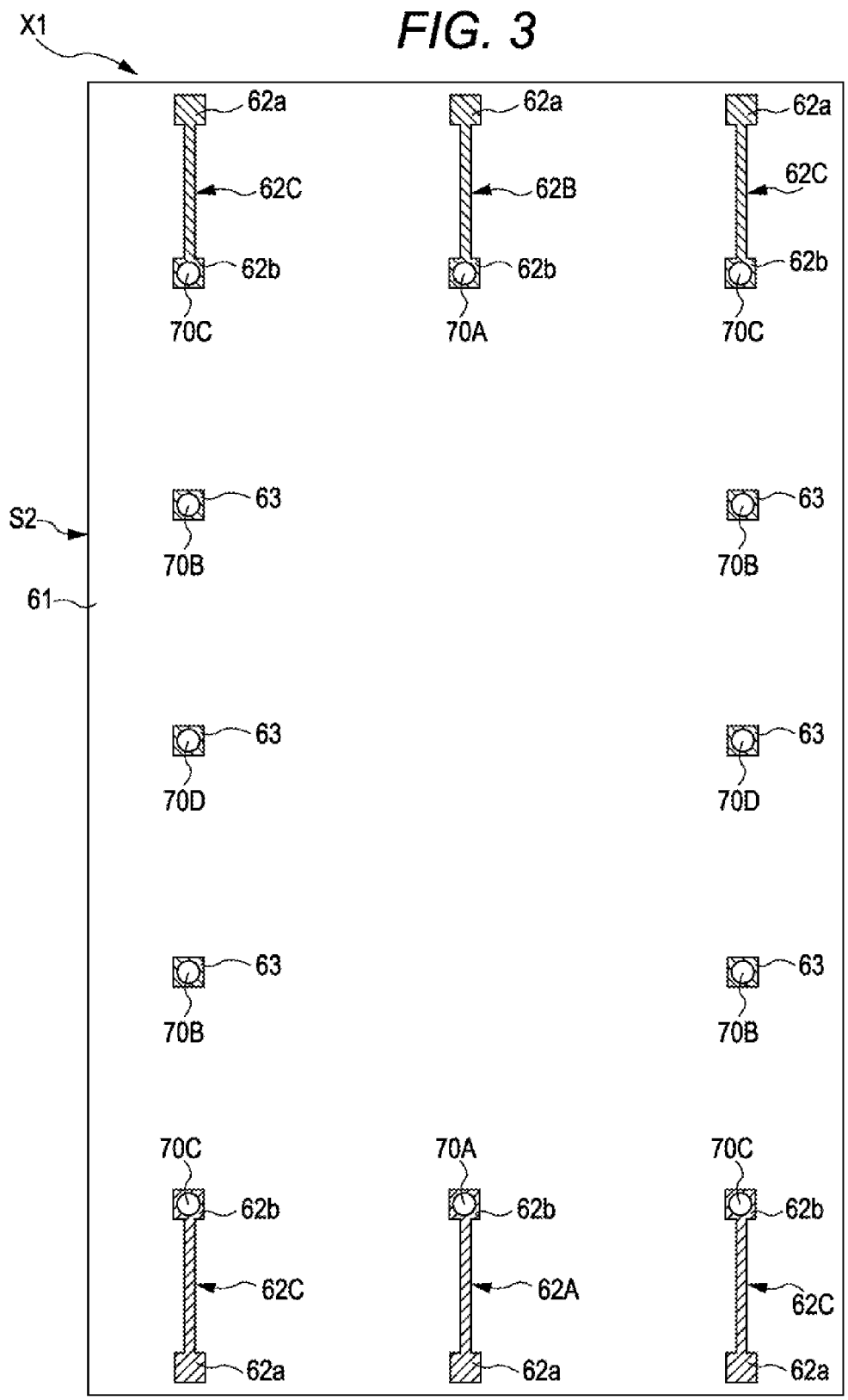
FIG. 3 is another plan view partially illustrating the micro movable device illustrated in FIG. 1.
Figure 7:
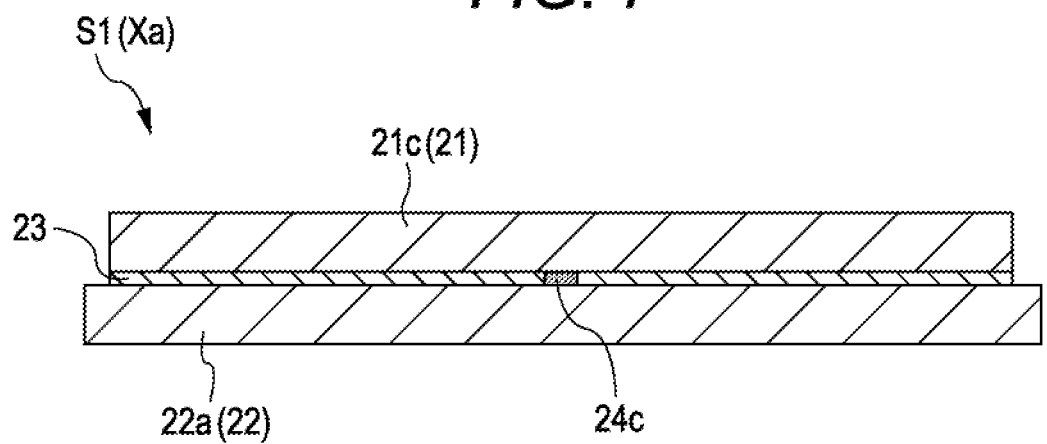
FIG. 7 is a sectional view along a line VII-VII in FIG. 1.
Figure 8:
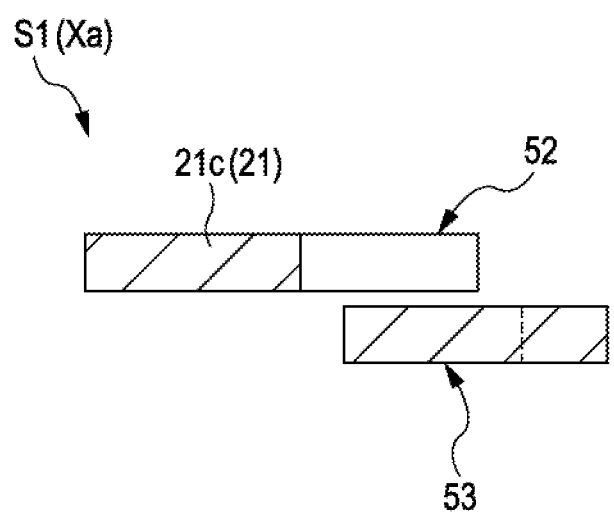
FIG. 8 is a sectional view along a line VIII-VIII in FIG. 1.
Figure 9:
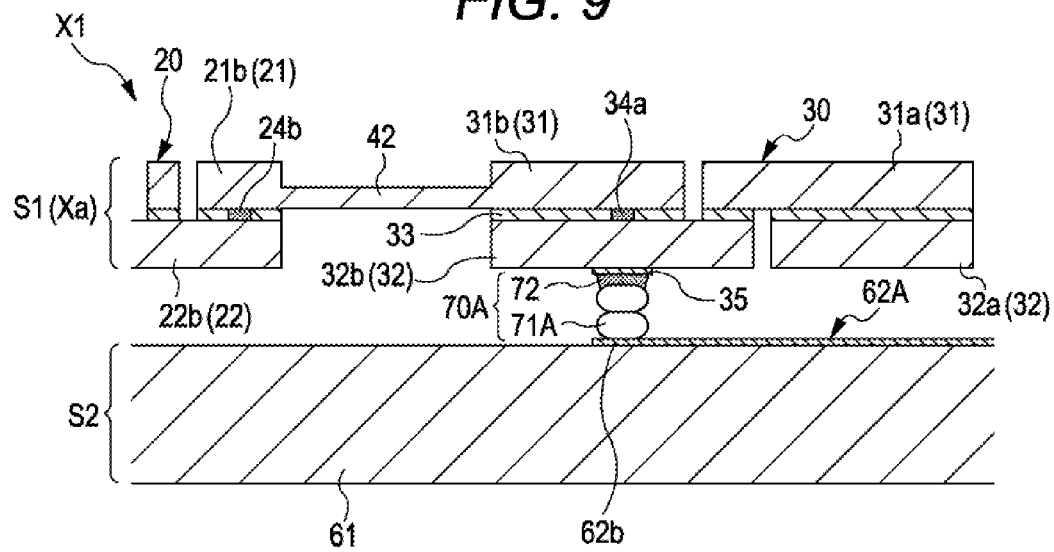
FIG. 9 is a sectional view along a line IX-IX in FIG. 1.
Figure 10:
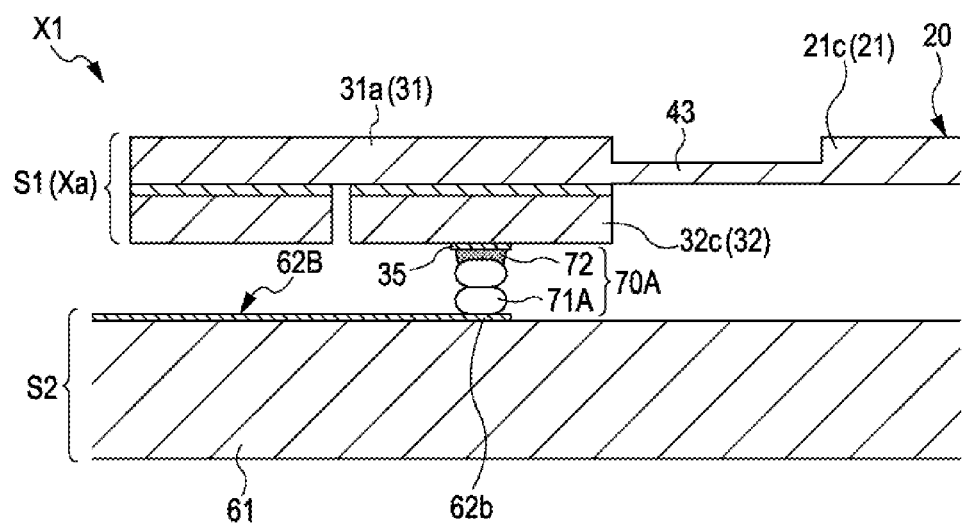
FIG. 10 is a sectional view along a line X-X in FIG. 1.

FIG. 1 to FIG. 11 illustrates a micro movable device X1 according to the first embodiment. FIG. 1 is a plan view of the micro movable device X1. FIG. 2 is a plan view partially illustrating the micro movable device X1. FIG. 3 is another plan view partially illustrating the micro movable device X1. FIG. 4 to FIG. 8 are sectional views along the line IV-IV, the line V-V, the line VI-VI, the line VII-VII, and the line VIII-VIII in FIG. 1 respectively. FIG. 9 and FIG. 10 are sectional views along the line IX-IX and the line X-X in FIG. 1 respectively. FIG. 11 is a sectional view along the line XI-XI in FIG. 1.

The micro movable device X1 includes a micro movable substrate S1, a wiring substrate S2, spacers 70A and 70B, and reinforced fixed parts 70C and 70D. In the present embodiment, the micro movable device X1 is applied to a micro mirror device.

As illustrated in FIG. 1, the micro movable substrate S1 has a micro movable unit Xa formed thereon. The micro movable unit Xa includes a rocking part 10, frames 20 and 30, a pair of connecting parts 41, a pair of connecting parts 42 and 43, and electrode parts 51, 52, and 53. The micro movable unit Xa is formed by processing a material substrate using bulk micromachining technology such as MEMS (micro-electromechanical systems) technology. An SOI (silicon on insulator) wafer, for example, is used as an material substrate. The material substrate includes a first silicon layer, a second silicon layer, and an insulating layer between the first and second silicon layers. The first and second silicon layers have conductivity added by being doped with impurities. Each of the above regions in the micro movable unit Xa is formed mainly originating from the first silicon layer or the second silicon layer. Thus, from the viewpoint of clarification of figures, regions originating from the first silicon layer in the micro movable unit Xa or the micro movable substrate S1 illustrated in FIG. 1 are illustrated with diagonal hatching. FIG. 2 illustrates regions originating from the second silicon layer in the micro movable unit Xa or the micro movable substrate S1.

The rocking part 10 of the micro movable unit Xa includes a land part 11, an electrode part 12, and a beam part 13.

The land part 11 is a region originating from the first silicon layer. A mirror surface 11a having the optical reflection function is provided on the surface of the land part 11. The land part 11 and the mirror surface 11a constitute a movable primary part in the micro movable unit Xa. A length W in the movable body or the land part 11 illustrated in FIG. 1 is, for example, 20 to 300 μm.

The electrode part 12 is a region originating from the first silicon layer. The electrode part 12 includes two arm parts and a plurality of electrode teeth extending from the arm parts. Thus, the electrode part 12 has a comb-like electrode structure.

The beam part 13 is a region originating from the first silicon layer. The beam part 13 connects the land part 11 and the electrode part 12.

Figure 4:
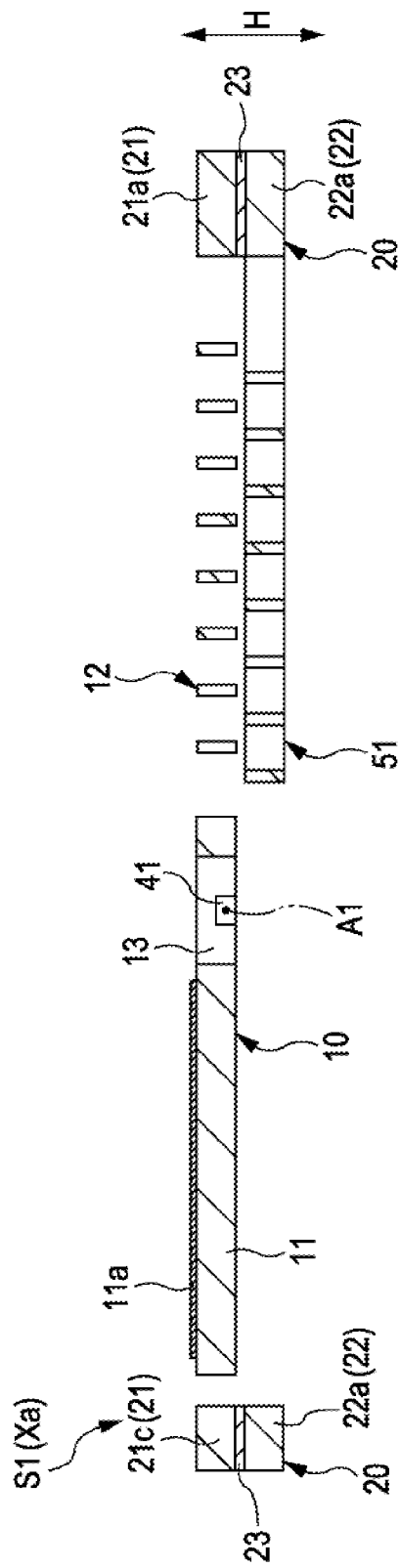
FIG. 4 is a sectional view along a line IV-IV in FIG. 1.
Figure 5:
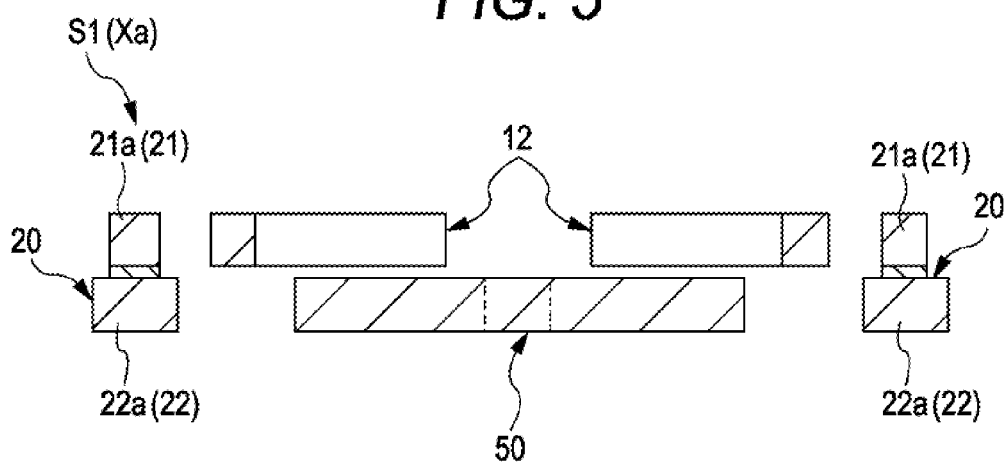
FIG. 5 is a sectional view along a line V-V in FIG. 1.
Figure 6:
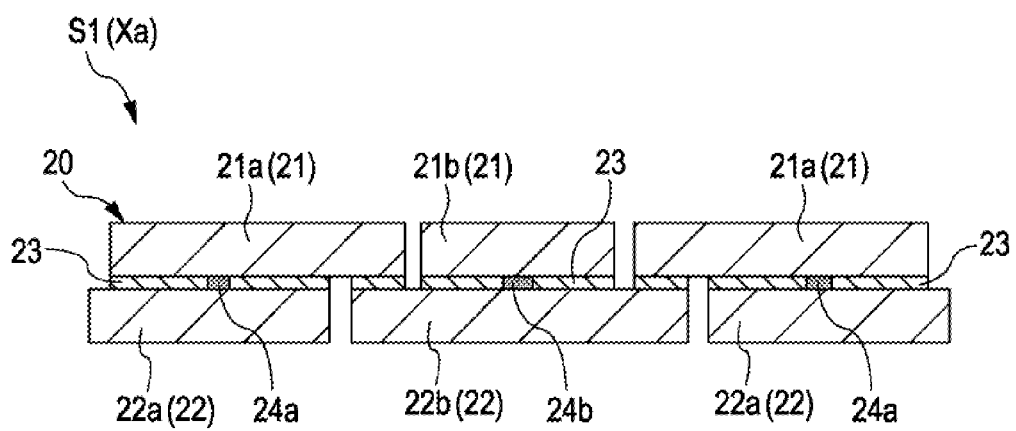
FIG. 6 is a sectional view along a line VI-VI in FIG. 1.

As illustrated in FIG. 4 and FIG. 6, the frame 20 includes a first layer 21 originating from the first silicon layer, a second layer 22 originating from the second silicon layer, and an insulating layer 23 between the first layer 21 and the second layer 22. The first layer 21 includes, as illustrated in FIG. 1, portions 21a, 21b, and 21c mutually set apart. The second layer 22 includes, as illustrated in FIG. 2, portions 22a, and 22b mutually set apart. As illustrated in FIG. 1, the portion 21a of the first layer 21 has a shape partially around the rocking part 10. The portion 22a of the second layer 22 is a frame body having a shape partially around the rocking part 10. As illustrated in FIG. 6, the portions 21a and 22a are electrically connected via a conductive via 24a penetrating through the insulating layer 23. The portions 21b and 22b are electrically connected via a conductive via 24b penetrating through the insulating layer 23. As illustrated in FIG. 7, the portions 21c and 22a are electrically connected via a conductive via 24c penetrating through the insulating layer 23.

As illustrated in FIG. 1 and FIG. 2, the frame 30 includes a first area 30A and a second area 30B. From the viewpoint of clarification of figures, the first area 30A is illustrated with a finer diagonal hatching. As illustrated in FIG. 9 to FIG. 11, the frame 30 includes a first layer 31 originating from the first silicon layer, a second layer 32 originating from the second silicon layer, and an insulating layer 33 between the first layer 31 and the second layer 32. The first layer 31 includes, as illustrated in FIG. 1, portions 31a and 31b mutually set apart. The second layer 32 includes, as illustrated in FIG. 2, portions 32a, 32b, 32c, and 32d mutually set apart. As illustrated in FIG. 9, the portions 31b and 32b are electrically connected via a conductive via 34a penetrating through the insulating layer 33. As illustrated in FIG. 11, the portions 31a and 32d are electrically connected via a conductive via 34b penetrating through the insulating layer 33. Pad parts 35 are provided, as illustrated in FIG. 9 to FIG. 11, on the surface of the portions 32a to 32d.

Each of the pair of connecting parts 41 is a torsion bar. Each of the connecting parts 41 is a region originating from the first silicon layer. Each of the connecting parts 41 is connected to the beam part 13 of the rocking part 10 and the portion 21a of the first layer 21 of the frame 20. As a result, the rocking part 10 and the frame 20 are connected to each other. The beam part 13 and the portion 21a are electrically connected via the connecting parts 41. As illustrated in FIG. 4, the connecting part 41 is thinner than the rocking part 10 in a thickness direction H and also thinner than the first layer 21 of the frame 20. The pair of connecting parts 41 described above defines an axial center A1 of rotational displacement of the rocking part 10 or the movable body (the land part 11, the mirror surface 11a). The direction in which electrode teeth of the electrode part 12 extend is parallel to that in which the axial center A1 extends.

The connecting parts 42 and 43 are each torsion bars. Each of the connecting parts 42 and 43 originates from the first silicon layer. Each of the connecting parts 42 and 43 connects the frame 20 and the frame 30. As illustrated in FIG. 1, the connecting part 42 is connected to the portion 21b of the first layer 21 of the frame 20 and the portion 31b of the first layer 31 of the frame 30. The frame 20 and the frame 30 are thereby connected. The portions 21b and 31b are electrically connected via the connecting part 42. The connecting part 43 is connected to the portion 21c of the first layer 21 of the frame 20 and the portion 31a of the first layer 31 of the frame 30. The frame 20 and the frame 30 are thereby connected. The portions 21c and 31a are electrically connected via the connecting part 43. Like the connecting parts 41, the connecting parts 42 and 43 are thinner than the first layer 21 of the frame 20 in the thickness direction H and also thinner than the first layer 31 of the frame 30. The pair of connecting parts 42 and 43 described above defines an axial center A2 of rotational displacement of the frame 20, the rocking part 10 and the like. In the present embodiment, the axial center A2 is orthogonal to the axial center A1.

The electrode part 51 originates from the second silicon layer. As illustrated in FIG. 2, the electrode part 51 includes an arm part and a plurality of electrode teeth extending from the arm part. Thus, the electrode part 51 has a comb-like electrode structure. The electrode part 51 extends from the portion 22b of the second layer 22 of the frame 20.

The electrode part 52 is a region originating from the first silicon layer. As illustrated in FIG. 1 and FIG. 8, the electrode part 52 includes a plurality of electrode teeth. The plurality of electrode teeth extends from the portion 21c of the first layer 21 of the frame 20 to the electrode part 53 side. Thus, the electrode part 52 has a comb-like electrode structure.

The electrode part 53 originates from the second silicon layer. As illustrated in FIG. 1, the electrode part 53 includes an arm part and a plurality of electrode teeth. The plurality of electrode teeth extends from the arm part to the electrode part 52 side. Thus, the electrode part 53 has a comb-like electrode structure. As illustrated in FIG. 2, the electrode part 53 extends from the portion 32c of the second layer 32 of the frame 30.

The rocking part 10, the frame 20, the connecting parts 41, and the electrode parts 51 and 52 are included in the movable part. A pair of electrodes 12 and 51 is included in a drive mechanism or actuator that generates a driving force for rotational displacement of the rocking part 10 around the axial center A1. A pair of electrode parts 52 and 53 is included in a drive mechanism or actuator that generates a driving force for rotational displacement around the axial center A2.

The frame 30 in the micro movable substrate S1 or the micro movable unit Xa includes, as described above, the first area 30A and the second area 30B. As illustrated in FIG. 1, the first area 30A is an area facing the movable part (the rocking part 10, the frame 20, the connecting parts 41, and the electrode parts 51 and 52) in the direction in which the above axial center A2 extends. The connecting parts 42 and 43 are connected to the first area 30A. The axial center A2 defined by the connecting parts 42 and 43 passes through the first area 30A. The second area 30B, on the other hand, is an area outside the first area 30A in the frame 30.

As illustrated in FIG. 3, the wiring substrate S2 of the micro movable device X1 includes a substrate 61, wiring patterns 62A, 62B, and 62C, and a pad part 63. The substrate 61 is made of a silicon material. The wiring patterns 62A, 62B, and 62C each include pad parts 62a and 62b. The pad part 62a is an external connection terminal for the micro movable device X1.

As illustrated in FIG. 9 and FIG. 10, the spacer 70A includes a bump part 71A and an adhesive part 72. The spacer 70A is provided between the frame 30 of the micro movable substrate S1 or the micro movable unit Xa and the wiring substrate S2. In the present embodiment, the bump part 71A includes two laminated bumps. Au, for example, may be used as the bump. The bump part 71A is pressure-welded to the pad part 62b of the wiring patterns 62A and 62B in the wiring substrate S2. The bump part 71A is bonded to the pad part 35 provided on the surface of the frame 30 of the micro movable substrate S1 via the adhesive part 72. The adhesive part 72 is made of a conductive adhesive. The conductive adhesive includes, for example, a conductive filler. As a conductive adhesive, for example, an epoxy adhesive in which 70 vol % or more of a conductive filler such as an Ag filler is contained may be adopted. In the present embodiment, the spacer 70A electrically connects the micro movable substrate S1 and the wiring substrate S2.

As illustrated in FIG. 11, the spacer 70B includes a bump part 71B and the adhesive part 72. The spacer 70B is provided between the frame 30 of the micro movable substrate S1 and the wiring substrate S2. In the present embodiment, the bump part 71B includes two laminated bumps. Au, for example, may be used for the bump. The bump part 71B is pressure-welded to the pad part 63 in the wiring substrate S2. The bump part 71B is bonded to the pad part 35 provided on the surface of the frame 30 of the micro movable substrate S1 via the adhesive part 72. The adhesive part 72 is made of, for example, a conductive adhesive.

As illustrated in FIG. 11, the reinforced fixed part 70C includes a bump part 71C and the adhesive part 72 and an adhesive part 73. The reinforced fixed part 70C is provided between the second area 30B of the frame 30 of the micro movable substrate S1 and the wiring substrate S2. The reinforced fixed part 70C joins the second area 30B of the frame 30 to the wiring substrate S2. In the present embodiment, the bump part 71C includes two laminated bumps. Au, for example, may be used for the bump. The bump part 71C is pressure-welded to the pad part 62b of the wiring pattern 62C in the wiring substrate S2. The bump part 71C is bonded to the pad part 35 provided on the surface of the second area 30B of the frame 30 in the micro movable substrate S1 via the adhesive part 72. As the adhesive part 72, for example, a conductive adhesive may be used. The bump part 71C is a spacer part in the reinforced fixed part 70C. The adhesive part 73 is made of an adhesive for fixing the substrates. The bump part 71C is covered with the adhesive part 73. The adhesive part 73 is bonded to the second area 30B of the frame 30 in the micro movable substrate S1 and the wiring substrate S2. An adhesive whose adhesive strength is stronger than that of a conductive adhesive, which is a material of the adhesive part 72, may be used as an adhesive for fixing the substrates. An epoxy adhesive may be adopted as such an adhesive for fixing the substrates. The reinforced fixed part 70C described above increases the fixing strength between the micro movable substrate S1 and the wiring substrate S2. Also, in the present embodiment, the reinforced fixed part 70C electrically connects the micro movable substrate S1 and the wiring substrate S2.

As illustrated in FIG. 11, the reinforced fixed part 70D includes a bump part 71D and the adhesive parts 72 and 73. The reinforced fixed part 70D is provided between the second area 30B of the frame 30 of the micro movable substrate S1 and the wiring substrate S2. The reinforced fixed part 70D joins the second area 30B of the frame 30 to the wiring substrate S2. In the present embodiment, the bump part 71D includes two laminated bumps. Au, for example, may be used for the bump. The bump part 71D is pressure-welded to the pad part 63 in the wiring substrate S2. The bump part 71D is bonded to the pad part 35 provided on the surface of the second area 30B of the frame 30 in the micro movable substrate S1 via the adhesive part 72. As the adhesive part 72, for example, a conductive adhesive is used. The bump part 71D forms a spacer part in the reinforced fixed part 70D. The adhesive part 73 is an adhesive for fixing the substrates. The bump part 71D is covered with the adhesive part 73. The adhesive part 73 is bonded to the second area 30B of the frame 30 in the micro movable substrate S1 and the wiring substrate S2. The reinforced fixed part 70D described above increases fixing strength between the micro movable substrate S1 and the wiring substrate S2.

When the micro movable device X1 is driven, a reference potential is provided to the electrode part 12 and electrode part 52 of the rocking part 10. The provision of the reference potential to the electrode part 12 is realized via the wiring pattern 62C (including the pad part 62a to be an external connection terminal) in the wiring substrate S2, the reinforced fixed part 70C, the pad part 35 bonded to the reinforced fixed part 70C on the micro movable substrate S1 side, the portion 32d of the second layer 32 of the frame 30 in the micro movable substrate S1, the conductive via 34b, the portion 31a of the first layer 31, the connecting part 43, the portion 21c of the first layer 21 of the frame 20, the conductive via 24c, the portion 22a of the second layer 22, the conductive via 24a, the portion 21a of the first layer 21, the connecting part 41, and the beam part 13 of the rocking part 10. The provision of the reference potential to the electrode part 52 is realized via the wiring pattern 62C (including the pad part 62a to be an external connection terminal) in the wiring substrate S2, the reinforced fixed part 70C, the pad part 35 bonded to the reinforced fixed part 70C on the micro movable substrate S1 side, the portion 32d of the second layer 32 of the frame 30 in the micro movable substrate S1, the conductive via 34b, the portion 31a of the first layer 31, the connecting part 43, and the portion 21c of the first layer 21 of the frame 20. The reference potential is, for example, a ground potential, and is preferably maintained constant.

Then, a drive potential higher than the reference potential is provided to each of the electrode parts 51 and 53 when necessary. Accordingly, when electrostatic attraction is generated between the electrode parts 12 and 51, as illustrated in FIG. 12, the rocking part 10 is rotationally displaced around the axial center A1. When electrostatic attraction is generated between the electrode parts 52 and 53, the frame 20, the rocking part 10 and the like are rotationally displaced around the axial center A2. The micro movable device X1 is a so-called two-axis movable device.

The provision of the drive potential to the electrode part 51 is realized via the wiring pattern 62A (including the pad part 62*a* to be an external connection terminal) in the wiring substrate S2, the spacer 70A on the pad part 62*b* of the wiring pattern 62A, the pad part 35 bonded to the spacer 70A on the micro movable substrate S1 side, the portion 32*b* of the second layer 32 of the frame 30 in the micro movable substrate S1, the conductive via 34*a*, the portion 31*b* of the first layer 31, the connecting part 42, the portion 21*b* of the first layer 21 of the frame 20, the conductive via 24*a*, and the portion 22*b* of the second layer 22. The provision of the drive potential to the electrode part 53 is realized via the wiring pattern 62B (including the pad part 62*a* to be an external connection terminal) in the wiring substrate S2, the spacer 70A on the pad part 62*b* of the wiring pattern 62B, the pad part 35 bonded to the spacer 70A on the micro movable substrate S1 side, and the portion 32*c* of the second layer 32 of the frame 30 in the micro movable substrate S1. By the two-axis rocking drive described above, the reflecting direction of light reflected by the mirror surface 11*a* provided on the land part 11 may be shifted.

The micro movable device X1 may be applied to a sensing device such as an angular velocity sensor and acceleration sensor. In the micro movable device X1 applied to a sensing device, the mirror surface 11*a* may not be provided on the land part 11 of the rocking part 10 in the micro movable unit Xa.

When the micro movable device X1 applied to an angular velocity sensor is driven, for example, the movable part (the rocking part 10, the frame 20, the connecting parts 41, and the electrode parts 51 and 52) is rotationally displaced around the axial center A2 at a specific frequency or cycle. The rotational displacement is realized by applying a voltage to between the electrode parts 52 and 53 at a specific cycle. In the present embodiment, for example, a potential is provided to the electrode part 53 at a specific cycle while the electrode part 52 is grounded.

If a specific angular velocity acts on the micro movable device X1 or the rocking part 10 while the movable part vibrates, the rocking part 10 is rotationally displaced around the axial center A1. Accordingly, the relative configuration of the electrode parts 12 and 51 changes and the electrostatic capacity between the electrode parts 12 and 51 changes. The rotational displacement of the rocking part 10 is detected based on the change of electrostatic capacity. The angular velocity acting on the micro movable device X1 or the rocking part 10 is derived based on a detection result of the rotational displacement.

When the micro movable device X1 applied to an acceleration sensor is driven, for example, the rocking part 10 may be immobilized relative to the frame 20 and the electrode part 51 by applying a DC voltage to between the electrode parts 12 and 51. If, in this state, an acceleration in the normal direction (the direction perpendicular to the surface of the plan view in FIG. 1) acts on the micro movable device X1 or the rocking part 10, an inertial force having a vector component parallel to the acceleration acts. Due to the inertial force, a running torque acts on the rocking part 10 to rotate around the axial center A1. Accordingly, a rotational displacement (rotational displacement around the axial center A1) of the rocking part 10 in proportion to the acceleration is caused. The inertial force is caused unless the center of gravity of the rocking part 10 overlaps with the axial center A1 in a plane view illustrated in FIG. 1. The rotational displacement is electrically detected as a change in electrostatic capacity between the electrode parts 12 and 51. The acceleration acting on the micro movable device X1 or the rocking part 10 is derived based on a detection result of the electrostatic capacity.

FIG. 13A to FIG. 16B illustrates a manufacturing process of the micro movable device X1. FIG. 13A to FIG. 14D illustrates a manufacturing method of the micro movable device X1 and the micro movable substrate S1. This method is a technique to form the micro movable unit Xa by bulk micro-machining technology. In FIG. 13A to FIG. 14D, a formation process of a land part L, a beam part B, frames F1, F2, and F3, connecting parts C1 and C2, and a pair of electrodes E1 and E2 illustrated in FIG. 14D is illustrated as changes of the sectional view. The land part L corresponds to a portion of the land part 11. The beam part B corresponds to the beam part 13. The frame F1 corresponds to a portion of the frame 20. The frames F2 and F3 each correspond to a portion of the frame 30. The connecting part C1 corresponds to the connecting part 41. The connecting part C2 corresponds to each of the connecting parts 41, 42, and 43. The electrode E1 corresponds to a portion of each of the electrode parts 12 and 52. The electrode E2 corresponds to a portion of each of the electrode parts 51 and 53. On the other hand, FIGS. 15A-15C illustrates a machining process on the wiring substrate S2 side. FIGS. 16A-16B illustrates a joining process of the micro movable substrate S1 and the wiring substrate S2.

Figure 13A:
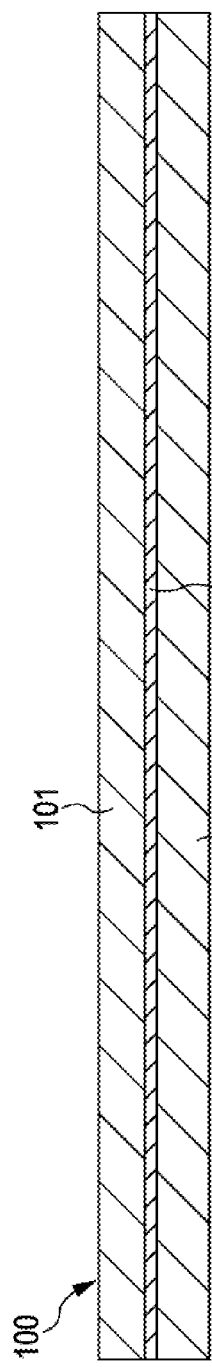
FIGS. 13A-13D are diagrams illustrating manufacturing processes of the micro movable device illustrated in FIG. 1.

For the formation of the micro movable unit Xa, first a material substrate 100 as illustrated in FIG. 13A is prepared. The material substrate 100 includes silicon layers 101 and 102 and an insulating layer 103 between the silicon layers 101 and 102. An SOI wafer, for example, may be used as the material substrate 100. The insulating layer 103 has conductive vias to become conductive vias 24*a* to 24*c*, 34*a*, and 34*b* later formed therein. The silicon layers 101 and 102 have conductivity added by being doped with impurities. P-type impurities such as B or n-type impurities such as P and Sb are adopted as impurities. The insulating layer 103 is made of, for example, silicon oxide. The silicon layer 101 has a thickness of, for example, 10 to 100 μm. The silicon layer 102 has a thickness of, for example, 50 to 500 μm. The insulating layer 103 has a thickness of, for example, 0.3 to 3 μm.

Figure 13B:
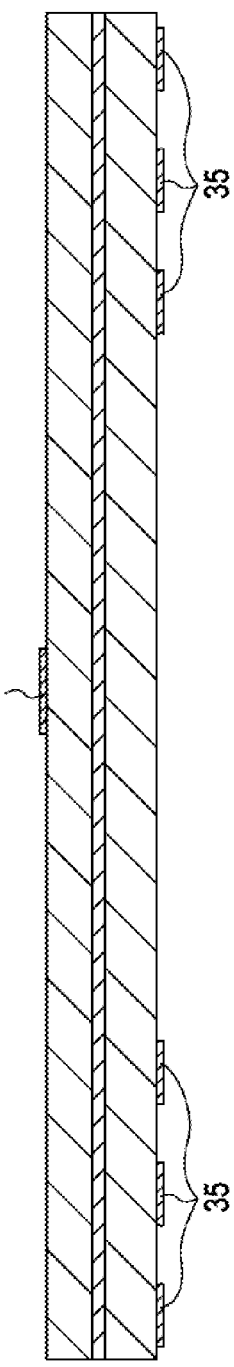

Next, as illustrated in FIG. 13B, the mirror surface 11*a* is formed on the silicon layer 101. The pad part 35, on the other hand, is formed on the silicon layer 102. To form the mirror surface 11*a*, first a metal film of, for example, Cr is formed on the silicon layer 101 by the sputtering method. The thickness of Cr is, for example, 50 nm. Subsequently, a metal film of Au or the like is formed. The thickness of Au is, for example, 200 nm. Next, the mirror surface 11*a* is patterned by successively etching these metal films using a mask. A potassium iodide-iodine solution, for example, is used as an etchant for Au. A ceric ammonium nitrate solution, for example, is used as an etchant for Cr. The pad part 35 on the silicon layer 102 is formed, for example, in the same manner as the mirror surface 11*a*.

Figure 13C:
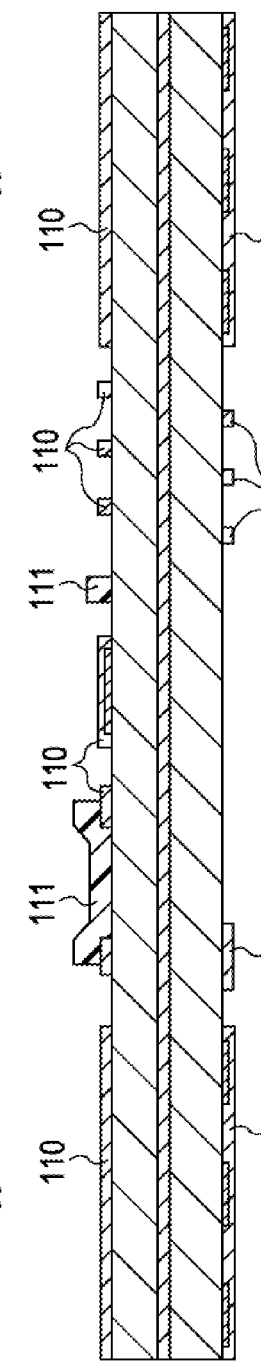
Figure 17:
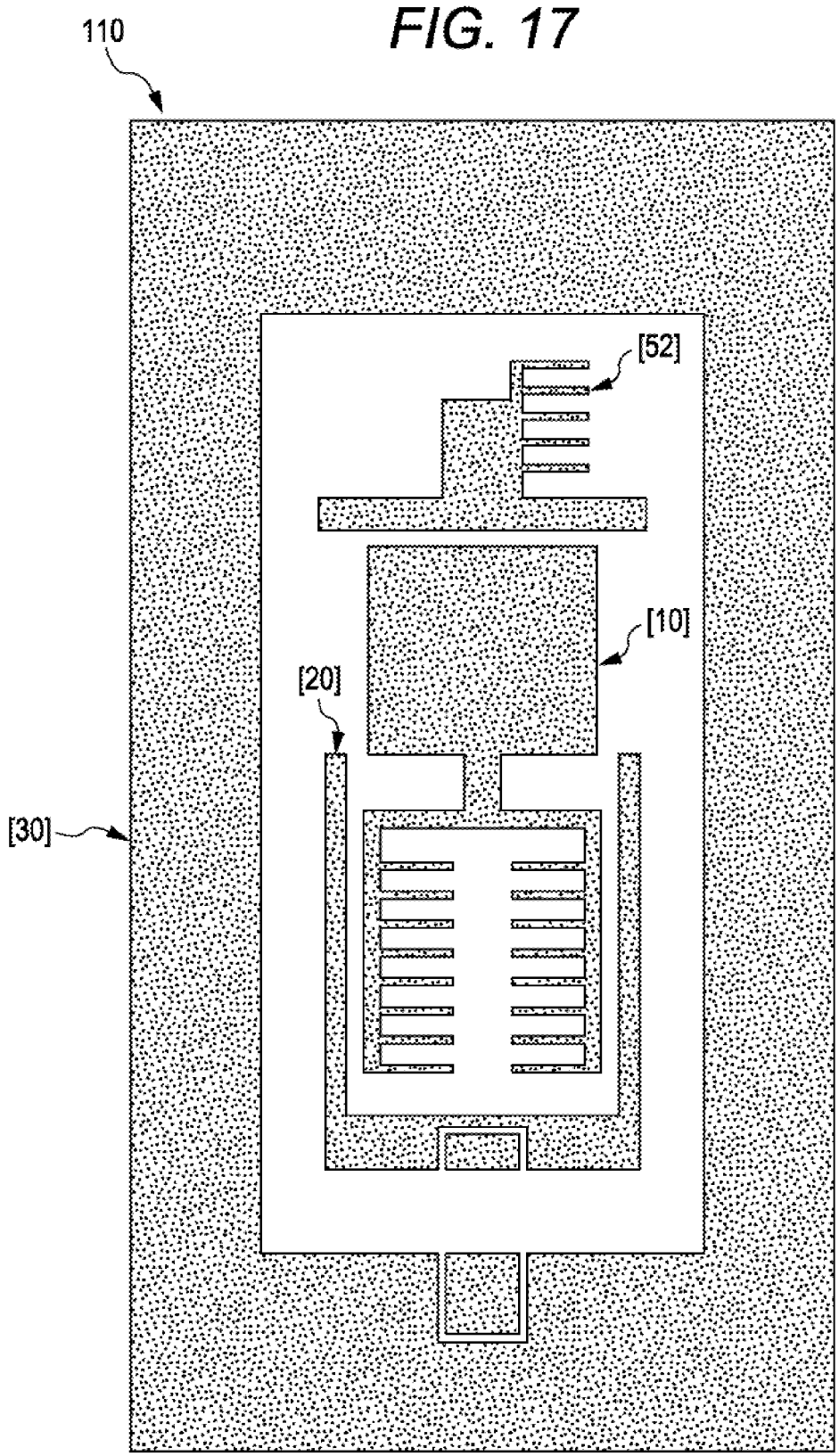
FIG. 17 is a plan view of a mask pattern.
Figure 18:
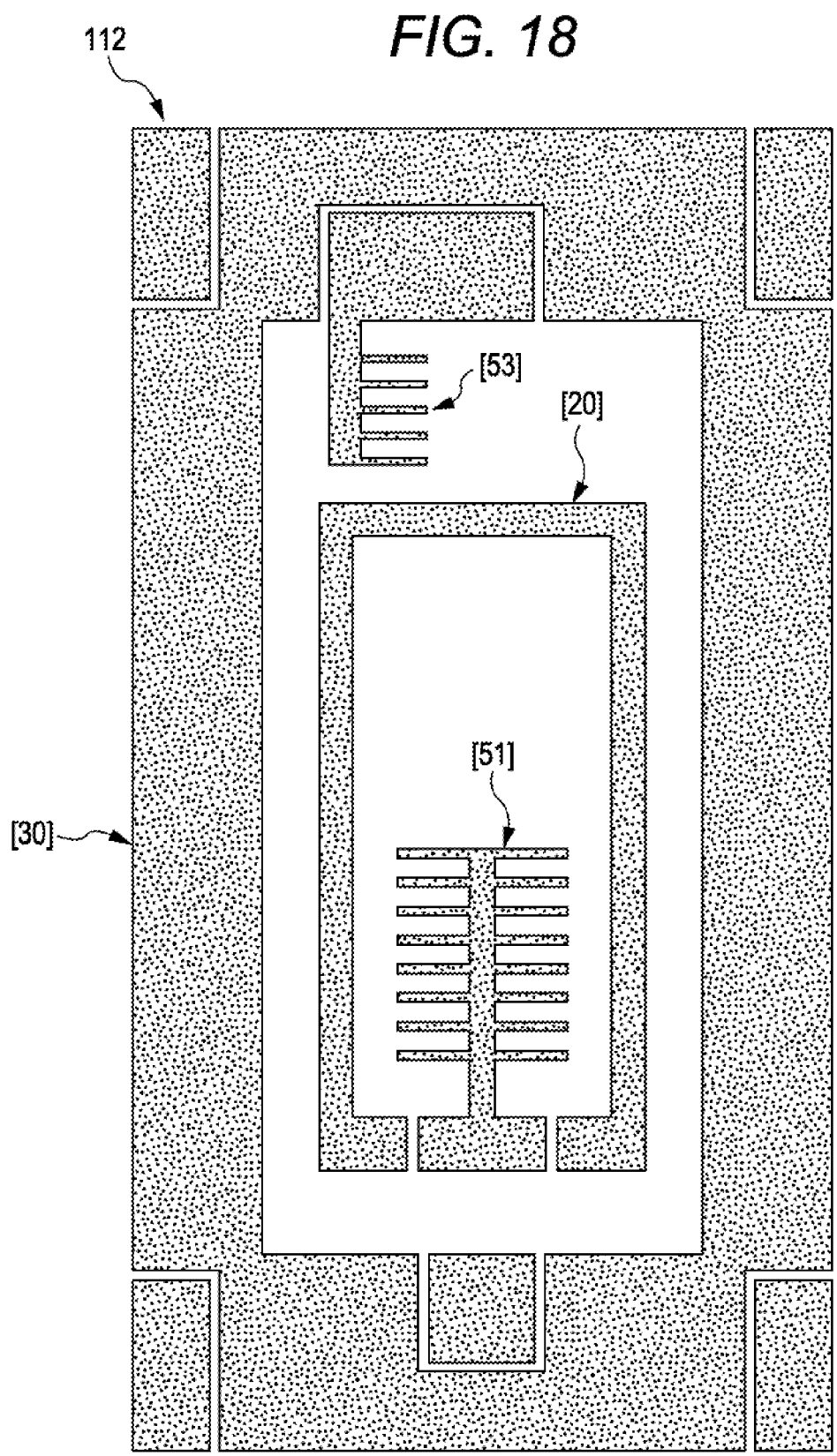
FIG. 18 is a plan view of another mask pattern.

Next, as illustrated in FIG. 13C, an oxide film pattern 110 and a resist pattern 111 are formed on the silicon layer 101. An oxide film pattern 112, on the other hand, is formed on the silicon layer 102. The oxide film pattern 110 has a pattern form illustrated in FIG. 17 corresponding to the rocking part 10 (the land part 11, the electrode part 12, and the beam part 13), the first layer 21 of the frame 20, the first layer 31 of the frame 30, and the electrode part 52. The resist pattern 111 has a pattern form corresponding to the connecting parts 41 to 43. The oxide film pattern 112 has a pattern form illustrated in FIG. 18 corresponding to the second layer 22 of the frame 20, the second layer 32 of the frame 30, and the electrode parts 51 and 53.

Figure 13D:
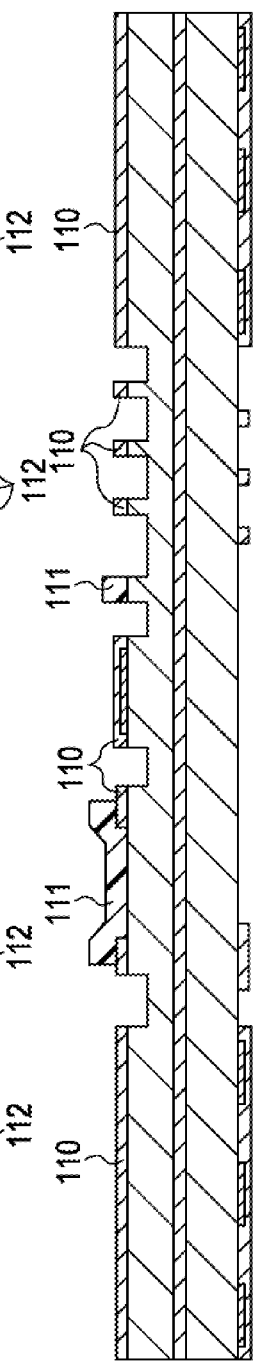

Next, as illustrated in FIG. 13D, the silicon layer 101 is etched to a specific depth by DRIE (deep reactive ion etching) using the oxide film pattern 110 and the resist pattern 111 as masks. The specific depth is a depth corresponding to the thickness of the connecting parts C1 and C2 and, for example, 5 μm. For example, the Bosch process may be used in DRIE. The Bosch process is a process in which etching using an SF6 gas and sidewall protection using a C4F8 gas are alternately performed. By using the Bosch process, a satisfactory anisotropic etching process may be performed. The Bosch process may also be used in DRIE described later.

Figure 14A:
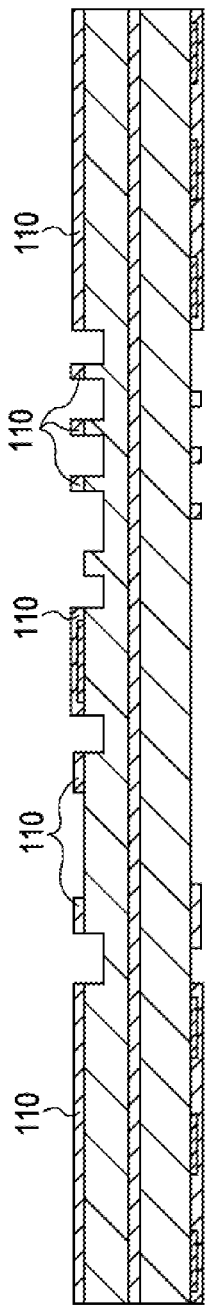
FIGS. 14A-14D are diagrams illustrating manufacturing processes subsequent to those in FIG. 13D.

Next, as illustrated in FIG. 14A, the resist pattern 111 is removed. For example, the resist pattern 111 may be peeled off by exposing the resist pattern 111 to a peeling liquid.

Figure 14B:
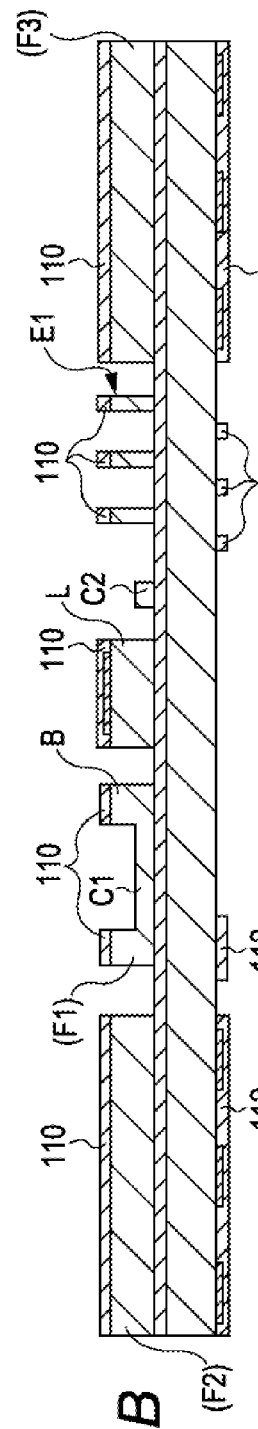

Next, as illustrated in FIG. 14B, an etching process is performed on the silicon layer 101 until the insulating layer 103 is reached by DRIE using the oxide film pattern 110 as a mask. The etching process here is performed in such a way that the connecting parts C1 and C2 are not removed. By this process, the land part L, the beam part B, the electrode E1, a portion of the frame F1 (the first layer 21 of the frame 20), a portion of the frame F2 (the first layer 31 of the frame 30), a portion of the frame F3 (the first layer 31 of the frame 30), and the connecting parts C1 and C2 are formed.

Figure 14C:
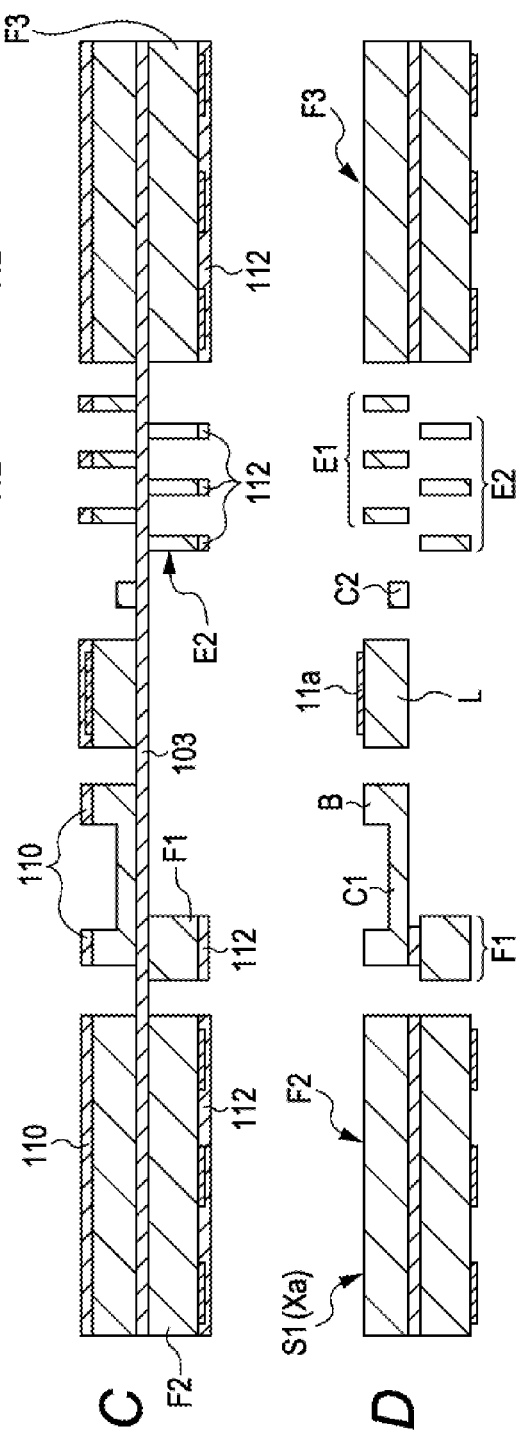

Next, as illustrated in FIG. 14C, an etching process is performed on the silicon layer 102 until the insulating layer 103 is reached by DRIE using the oxide film pattern 112 as a mask. By this process, a portion of the frame F1 (the second layer 22 of the frame 20), a portion of the frame F2 (the second layer 32 of the frame 30), a portion of the frame F3 (the second layer 32 of the frame 30), and the electrode E2 are formed.

Figure 14D:
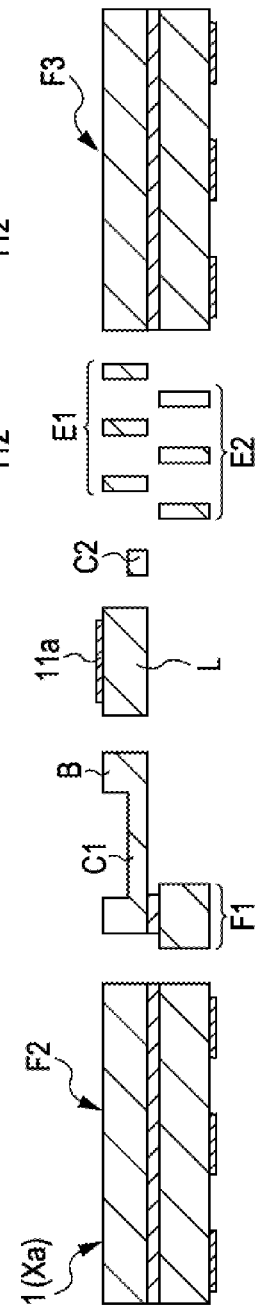

Next, as illustrated in FIG. 14D, the exposed insulating layer 103 and the oxide film patterns 110 and 112 are removed by etching. Dry etching or wet etching is adopted as the etching technique. If dry etching is adopted, for example, CF4 or CHF3 may be adopted as an etching gas. If wet etching is adopted, for example, buffered fluorine (BHF) containing fluoric acid and ammonium fluoride may be used as an etchant. After this process, individual pieces of the micro movable units Xa are prepared by cutting the material substrate 100.

By undergoing the above processes, the micro movable substrate S1 with the prepared micro movable unit Xa is produced.

In the manufacture of the micro movable device X1, on the other hand, as illustrated in FIG. 15A, the bump parts 71A, 71B, 71C, and 71D are formed on the wiring substrate S2. On the surface of the wiring substrate S2, the wiring patterns 62A, 62B, and 62C including pad parts 62a and 62b and the pad part 63 are formed in advance. In this process, a laminated bump is formed by piling up two bumps on the pad parts 62b and 63 using a bump bonder. In this case, pressure-welding is applied between the pad part and bump and between the bumps. Next, the height of each laminated bump is adjusted by leveling. Accordingly, the bump parts 71A, 71B, 71C, and 71D are formed. More specifically, the top part of each laminated bump is pushed against a flat surface such as glass plate.

Next, as illustrated in FIG. 15B, a heat-hardening conductive adhesive 72' is supplied to the top part of the bump parts 71A, 71B, 71C, and 71D. The wiring substrate S2 is aligned with a flat substrate to which the conductive adhesive 72' is applied to a uniform thickness (for example, 25 μm) via the bump parts 71A, 71B, 71C, and 71D. Accordingly, the conductive adhesive 72' may be transferred to the top part of the bump parts 71A, 71B, 71C, and 71D.

Next, as illustrated in FIG. 15C, a heat-hardening substrate fixing adhesive 73' is applied to the bump parts 71C and 71D. For example, a dispenser is used to apply the substrate fixing adhesive 73' so as to cover the bump parts 71C and 71D with the heat-hardening adhesive. The amount of the substrate fixing adhesive 73' supplied so as to cover the bump parts 71C and 71D with the adhesive is larger than that of the conductive adhesive 72' supplied only to the top part of the bump parts 71A, 71B, 71C, and 71D.

After the substrate fixing adhesive 73' is supplied, as illustrated in FIG. 16A and FIG. 16B, the micro movable substrate S1 and the wiring substrate S2 are joined via the bump parts 71A, 71B, 71C, and 71D, the conductive adhesive 72', and the substrate fixing adhesive f 73'. In this process, the adhesive parts 72 and 73 are formed by heat-hardening the conductive adhesive 72' and the substrate fixing adhesive f 73'.

The micro movable device X1 containing the micro movable substrate S1, the wiring substrate S2, and the spacers 70A and 70B and the reinforced fixed parts 70C and 70D that join the micro movable substrate S1 to the wiring substrate S2 is manufactured according to the method described above.

In the joining process of the micro movable substrate S1 and the wiring substrate S2, the adhesive part 73 of the reinforced fixed parts 70C and 70D is formed by hardening the substrate fixing adhesive 73'. At this point, a frictional force against contraction of the substrate fixing adhesive 73' is generated at an interface between the hardening substrate fixing adhesive f 73' and the bump parts 71C and 71D. The contraction when the substrate fixing adhesive f 73' hardens is thereby suppressed. Moreover, if the substrate fixing adhesive 73' contracts when it hardens, a stress is generated in a bonding part of a reinforced fixed part in the frame 30 of the micro movable substrate S1. However, the reinforced fixed parts 70C and 70D are bonded to the second area 30B, instead of the first area 30A, in the frame 30 of the micro movable substrate S1 or the micro movable unit Xa. Thus, the stress is less likely to be transferred to the connecting parts 42 and 43. The first area 30A of the frame 30 is an area of the frame 30 facing the movable part in a direction in which the axial center A2 extends. The connecting parts 42 and 43 are connected to the first area 30A. The axial center A2 defined by the connecting parts 42 and 43 passes through the first area 30A. In the frame 30, with a decreasing distance from the axial center A2 to a part where a stress acts, the stress is more likely to be transferred to the connecting parts 42 and 43. Thus, the spring constant of the connecting parts 42 and 43 is more likely to vary. In the present embodiment, however, the reinforced fixed parts 70C and 70D are bonded to the second area 30B, which is farther away from the axial center A2 than the first area 30A. Thus, a stress acting on a bonding part of a reinforced fixed part is less likely to be transferred to the connecting parts 42 and 43.

Thus, in the present embodiment, the contraction of the substrate fixing adhesive f 73' is suppressed when the micro movable substrate S1 and the wiring substrate S2 are joined. Further, a stress acting on a bonding part of a reinforced fixed part due to contraction of the substrate fixing adhesive 73' is less likely to be transferred to the connecting parts 42 and 43. Therefore, variations in the spring constant of the connecting parts 42 and 43 before and after the micro movable substrate S1 and the wiring substrate S2 are joined may be suppressed.

In the manufactured micro movable device X1, on the other hand, the volume of the adhesive part 73 of the reinforced fixed parts 70C and 70D is inhibited from being changed by a temperature change. This is because a frictional force against volume change of the adhesive part 73 is generated at an interface between the adhesive part 73 and the bump parts 71C and 71D. If the volume of the adhesive part 73 of the reinforced fixed parts 70C and 70D changes due to a temperature change, a stress acts on a bonding part of a reinforced fixed part in the frame 30 of the micro movable substrate S1. However, the reinforced fixed parts 70C and 70D are bonded to the second area 30B, which is farther away from the axial center A2 than the first area 30A. Thus, the stress is less likely to be transferred to the connecting parts 42 and 43. Thus, according to the present embodiment, the volume change of the adhesive part 73 of the reinforced fixed parts 70C and 70D due to a temperature change is suppressed. Further, a stress acting on a bonding part of a reinforced fixed part due to a volume change of the adhesive part 73 is less likely to be transferred to the connecting parts 42 and 43. Therefore, variations in the spring constant of the connecting parts 42 and 43 after the micro movable substrate S1 and the wiring substrate S2 are joined may also be suppressed.

Thus, the micro movable device X1 is suitable for suppressing variations in the spring constant of the connecting parts 42 and 43 both during and after a manufacturing process. The micro movable device X1 described above is suitable for suppressing variations of mechanical characteristics such as the resonance frequency of the movable part. Therefore, degradation in device performance is suppressed.

In the present embodiment, the base material of the micro movable substrate S1 is a silicon material and the substrate 61, which is the base material of the wiring substrate S2, is also made of a silicon material. Thus, the difference between a volume change of the micro movable substrate S1 and that of the wiring substrate S2 (supporting substrate) resulting from a temperature change is made small. Therefore, the micro movable device X1 is suitable for suppressing a stress generated in a bonding part of a reinforced fixed part in the frame 30 of the micro movable substrate S1.

Figure 19A:
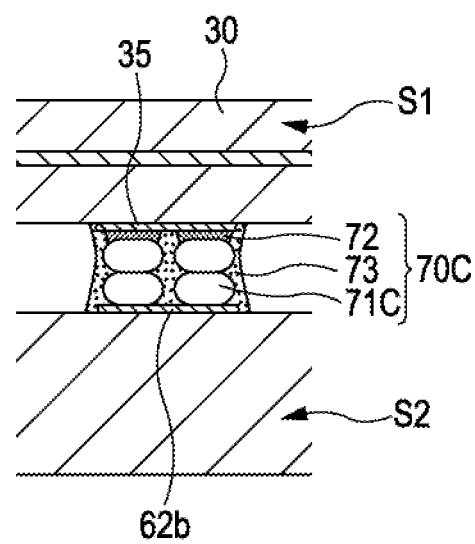
FIG. 19A is a sectional view of a reinforced fixed part according to a modification in a thickness direction of a wiring substrate.
Figure 19B:
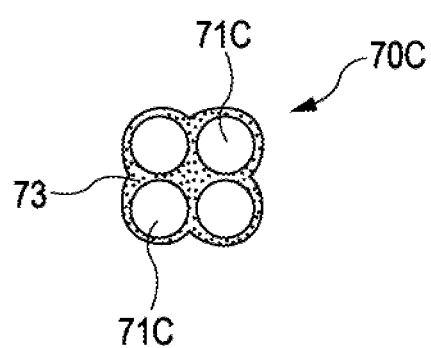
FIG. 19B is a sectional view of the reinforced fixed part according to the modification in a surface direction of the wiring substrate.

FIGS. 19A-19B illustrates a modification of the reinforced fixed part 70C. FIG. 19A is a sectional view including the modification in the thickness direction of the wiring substrate S2. FIG. 19B is a sectional view including the modification in a surface direction of the wiring substrate S2. The reinforced fixed part 70C illustrated in FIGS. 19A-19B contains a plurality of the bump parts 71C. Each of the plurality of the bump parts 71C contains two laminated bumps. Au, for example, may be used as the bump material. The plurality of the bump parts 71C is pressure-welded to the single pad part 82b in the wiring substrate S2. Each of the plurality of the bump parts 71C is bonded to the pad part 35 provided on the surface of the frame 30 of the micro movable substrate S1 by the adhesive part 72. A conductive adhesive, for example, is used as the adhesive part 72. The conductive adhesive may contain, for example, a conductive filler. The adhesive part 73 is made of an adhesive for fixing the substrates. The plurality of the bump parts 71C is covered with the adhesive part 73. The adhesive part 73 is bonded to the micro movable substrate S1 and the wiring substrate S2. Since the reinforced fixed part 70C described above has a smaller volume ratio of the adhesive part 73 than that of the reinforced fixed part 70C containing the single bump part 71C, the substrate fixing adhesive 73' is less likely to contract in the bonding process (a process in which the substrate fixing adhesive 73' hardens) of the micro movable substrate S1 and the wiring substrate S2. Therefore, the reinforced fixed part 70C containing the plurality of the bump parts 71C illustrated in FIGS. 19A-19B is suitable for suppressing variations in the spring constant of the connecting parts 42 and 43.

Like the reinforced fixed part 70C, the reinforced fixed part 70D may contain a plurality of the bump parts 71D. The spacer 70A may also contain a plurality of the bump parts 71A. The spacer 70B may also contain a plurality of the bump parts 71B.

Figure 20:
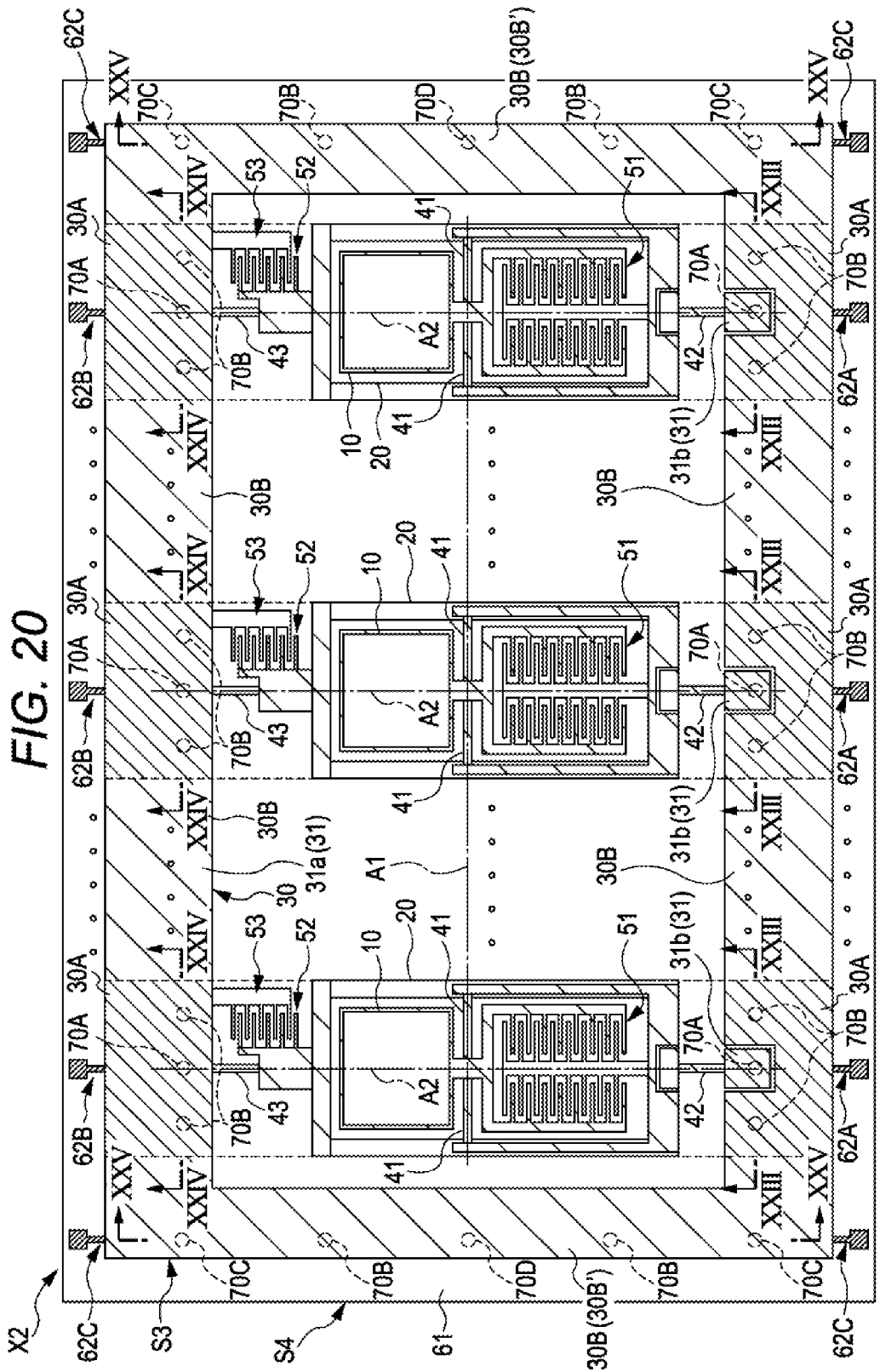
FIG. 20 is a plan view of a micro movable device according to a second embodiment.

FIG. 20 to FIG. 25 illustrates a micro movable device X2 according to the second embodiment. FIG. 20 is a plan view of the micro movable device X2.

Figure 21:
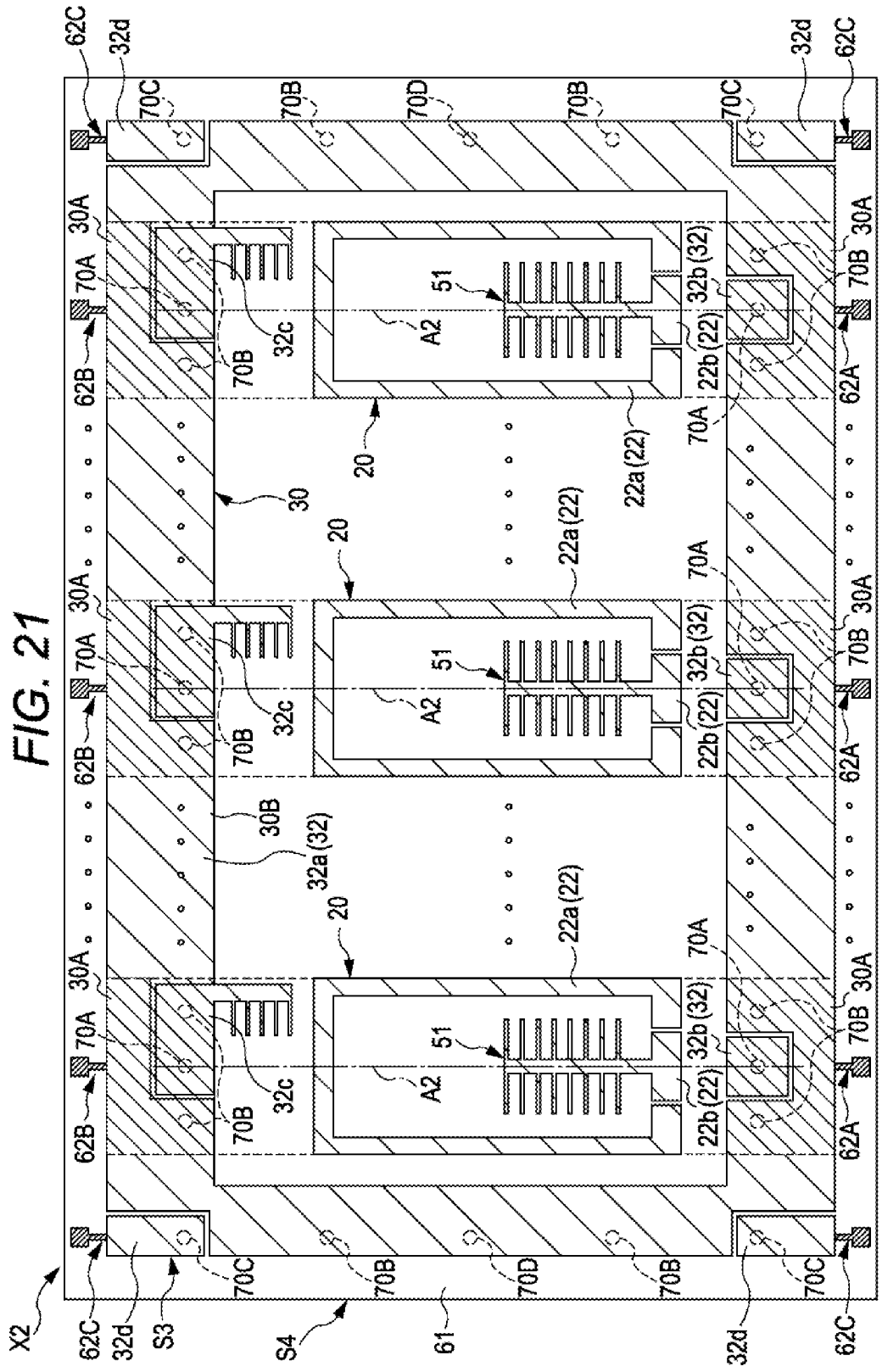
FIG. 21 is a plan view partially illustrating the micro movable device illustrated in FIG. 20.
Figure 22:
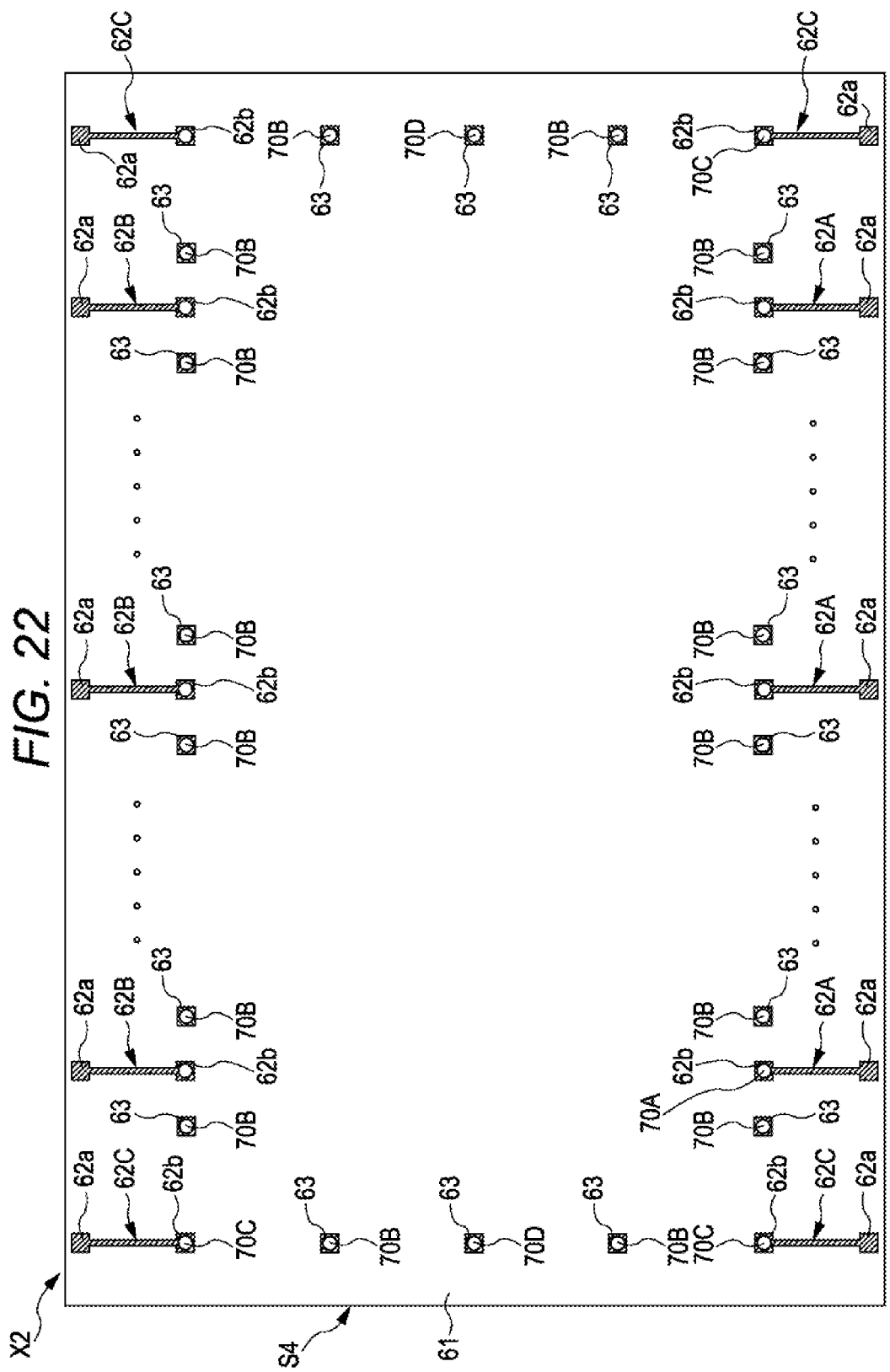
FIG. 22 is another plan view partially illustrating the micro movable device illustrated in FIG. 20.
Figure 23:
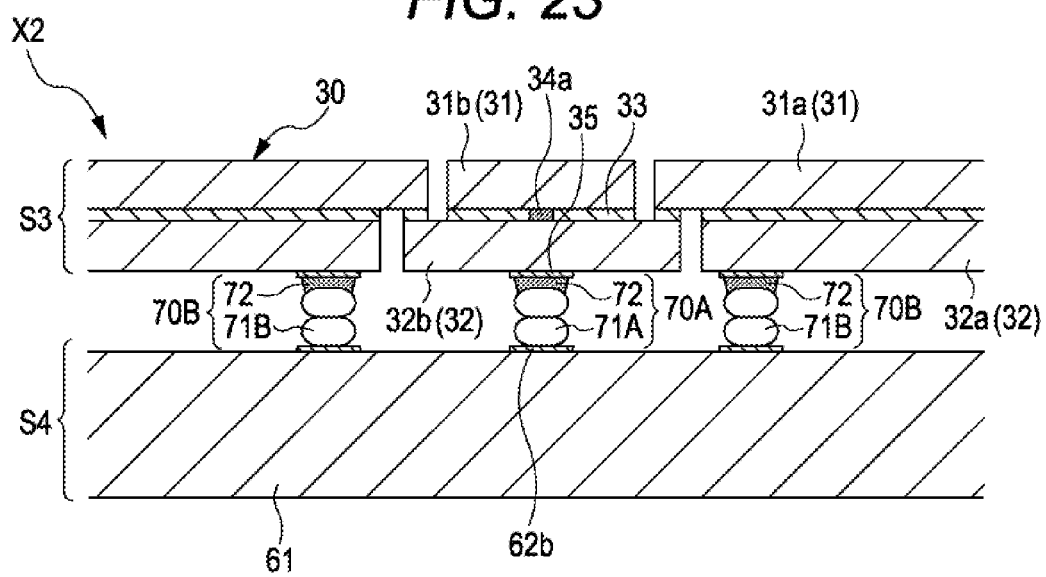
FIG. 23 is a sectional view along a line XXIII-XXIII in FIG. 20.
Figure 24:
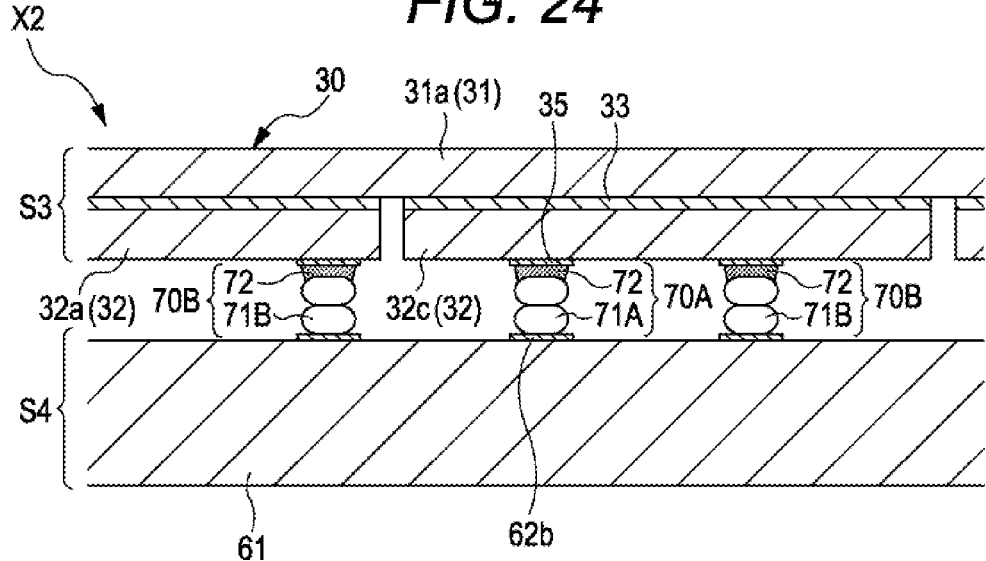
FIG. 24 is a sectional view along a line XXIV-XXIV in FIG. 20.
Figure 25:
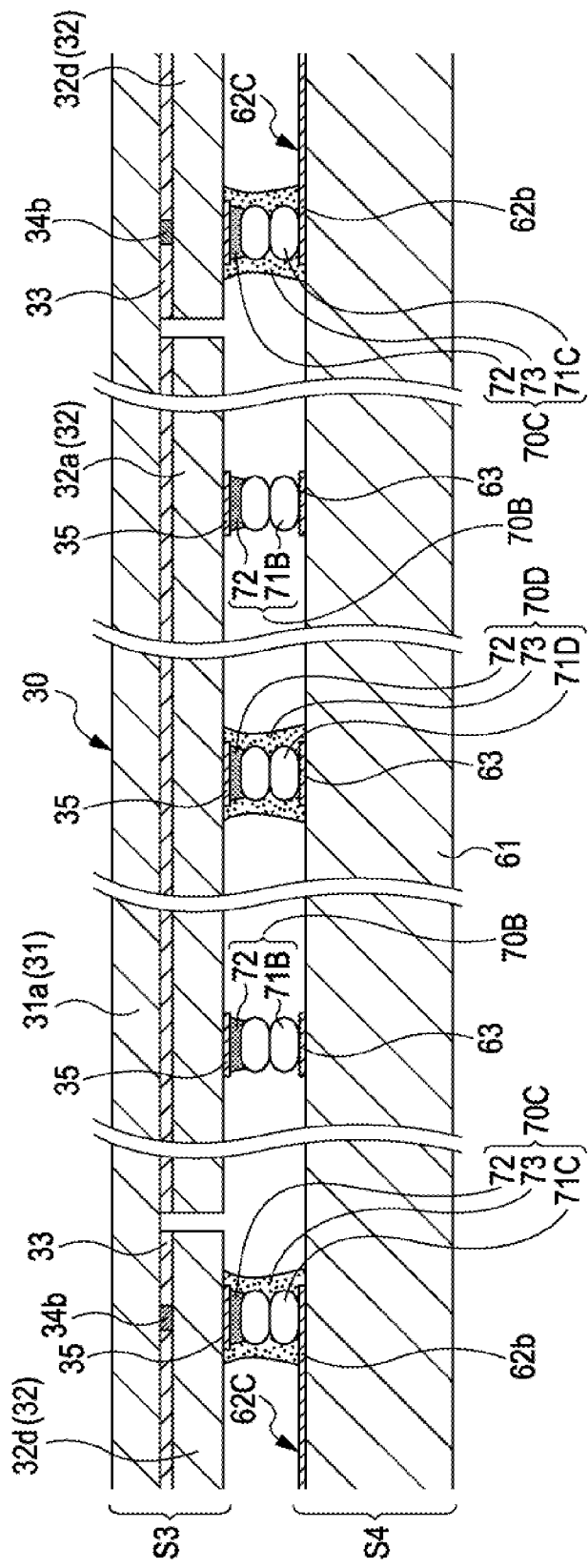
FIG. 25 is a sectional view along a line XXV-XXV in FIG. 20.

FIG. 21 is a plan view partially illustrating the micro movable device X2. FIG. 22 is another plan view partially illustrating the micro movable device X2. FIG. 23 and FIG. 24 are sectional views along a line XXIII-XXIII and a line XXIV-XXIV in FIG. 20 respectively. FIG. 25 is a sectional view along a line XXV-XXV in FIG. 20.

The micro movable device X2 includes a micro movable substrate S3, a wiring substrate S4, the spacers 70A and 70B, and the reinforced fixed parts 70C and 70D. In the present embodiment, the micro movable device X2 may be applied to a micro mirror device.

In the micro movable substrate S3, a plurality of the above micro movable units Xa is prepared. Each micro movable unit Xa includes the rocking part 10, the frames 20 and 30, a pair of connecting parts 41, a pair of connecting parts 42 and 43, and the electrode parts 51, 52, and 53. The plurality of the micro movable units Xa is arranged in a row in the direction in which the axial center A1 extends so that all the axial centers A2 are parallel to one another. Like the micro movable unit Xa in the first embodiment, the micro movable unit Xa in the present embodiment is also prepared by processing a material substrate using a bulk micro-machining technology such as MEMS technology. An SOI wafer, for example, may be used as a material substrate. The material substrate includes a first silicon layer, a second silicon layer, and an insulating layer between the first and second silicon layers. Each silicon layer has conductivity added by being doped with impurities. Each of the above regions in the micro movable unit Xa is formed mainly originating from the first silicon layer or the second silicon layer. Thus, from the viewpoint of clarification of figures, regions originating from the first silicon layer in the micro movable unit Xa or the micro movable substrate S3 illustrated in FIG. 20 are depicted with diagonal hatching. FIG. 21 illustrates regions originating from the second silicon layer in the micro movable unit Xa or the micro movable substrate S3. That is, in FIG. 21, regions originating from the first silicon layer, regions formed on the first silicon layer, and regions originating from the insulating layer in the micro movable substrate S3 are omitted.

In the micro movable device X2, the frame 30 of each micro movable unit Xa is made common. The portion 31a of the first layer 31 of the frame 30 is continuous extending over all the micro movable units Xa. Each portion 32d of the second layer 32 of the frame 30 is provided in common with all the micro movable units Xa. The movable part of all the micro movable units Xa including the rocking part 10 and the frame 20 is surrounded by the frame 30 made common as described above. In the micro movable substrate S3 in which the frame 30 made common is formed, the electrode part 12 of the rocking part 10, the portions 21a and 21c of the first layer 21, the portion 22a of the second layer 22 of the frame 20, the portion 32d of the second layer 32 of the frame 30, and the electrode part 52 in all the micro movable units Xa are electrically connected.

The frame 30 in the micro movable substrate S3 includes the first area 30A and the second area 30B. As illustrated in FIG. 20, the first area 30A is an area facing the movable part (the rocking part 10, the frame 20, the connecting parts 41, and the electrode parts 51 and 52) of each micro movable unit Xa in the direction in which the axial center A2 extends. The connecting parts 42 and 43 are connected to the first area 30A. The axial center A2 defined by the connecting parts 42 and 43 passes through the first area 30A. The second area 30B, on the other hand, is an area outside the first area 30A in the frame 30. The second area 30B includes an outermost second area 30'.

As illustrated in FIG. 22, the wiring substrate S4 of the micro movable device X2 includes the substrate 61, the wiring patterns 62A, 62B, and 62C, and the pad part 63. The substrate 61 is made of a silicon material. The wiring patterns 62A, 62B, and 62C each include the pad parts 62a and 62b. The pad part 62a is an external connection terminal for the micro movable device X2.

As illustrated in FIG. 23 and FIG. 24, the spacer 70A of the micro movable device X2 includes the bump part 71A and the adhesive part 72. The spacer 70A is provided between the frame 30 of the micro movable substrate S3 and the wiring substrate S4. In the present embodiment, the bump part 71A includes two laminated bumps. Au, for example, may be used as a bump material. The bump part 71A is pressure-welded to the pad part 62b of the wiring patterns 62A and 62B in the wiring substrate S4. The bump part 71A is bonded to the pad part 35 provided on the surface of the frame 30 of the micro movable substrate S3 by the adhesive part 72. The adhesive part 72 is made of a conductive adhesive. In the present embodiment, the spacer 70A electrically connects the micro movable substrate S3 and the wiring substrate S4.

As illustrated in, for example, FIG. 23 and FIG. 24, the spacer 70B of the micro movable device X2 includes the bump part 71B and the adhesive part 72. The spacer 70B is provided between the frame 30 of the micro movable substrate S3 and the wiring substrate S4. In the present embodiment, the bump part 71B includes two laminated bumps. Au, for example, may be used as a bump material. The bump part 71B is pressure-welded to the pad part 63 in the wiring substrate S4. The bump part 71B is bonded to the pad part 35 provided on the surface of the frame 30 of the micro movable substrate S3 by the adhesive part 72. As the adhesive part 72, for example, a conductive adhesive is used.

As illustrated in FIG. 25, the reinforced fixed part 70C of the micro movable device X2 includes the bump part 71C and the adhesive parts 72 and 73. The reinforced fixed part 70C is provided between the second area 30B (or the outermost second area 30B') of the frame 30 of the micro movable substrate S3 and the wiring substrate S4 to join these. In the present embodiment, the bump part 71C includes two laminated bumps. Au, for example, may be used as a bump material. The bump part 71C is pressure-welded to the pad part 62b of the wiring pattern 62C in the wiring substrate S4. The bump part 71C is bonded to the pad part 35 provided on the surface of the second area 30B (or the outermost second area 30B') of the frame 30 in the micro movable substrate S3 by the adhesive part 72. As the adhesive part 72, for example, a conductive adhesive is used. The bump part 71C forms a spacer part in the reinforced fixed part 70C. The adhesive part 73 is made of an adhesive for fixing the substrates. The bump part 71C is covered with the adhesive part 73. The adhesive part 73 is bonded to the second area 30B of the frame 30 in the micro movable substrate S3 and the wiring substrate S4. The reinforced fixed part 70C described above increases the fixing strength between the micro movable substrate S3 and the wiring substrate S4. Also, in the present embodiment, the reinforced fixed part 70C electrically connects the micro movable substrate S3 and the wiring substrate S4.

As illustrated in FIG. 25, the reinforced fixed part 70D of the micro movable device X2 includes the bump part 71D and the adhesive parts 72 and 73. The reinforced fixed part 70D is provided to join the second area 30B (or the outermost second area 30B') of the frame 30 of the micro movable substrate S3 to the wiring substrate S4 t. In the present embodiment, the bump part 71D includes two laminated bumps. Au, for example, may be used as a bump material. The bump part 71D is pressure-welded to the pad part 63 in the wiring substrate S4. The bump part 71D is bonded to the pad part 35 provided on the surface of the second area 30B of the frame 30 by the adhesive part 72. As the adhesive part 72, for example, a conductive adhesive is used. The bump part 71D forms a spacer part in the reinforced fixed part 70D. The adhesive part 73 is made of an adhesive for fixing the substrates. The bump part 71D is covered with the adhesive part 73. The adhesive part 73 joins the second area 30B of the frame 30 in the micro movable substrate S3 to the wiring substrate S4. The reinforced fixed part 70D described above increases fixing strength between the micro movable substrate S3 and the wiring substrate S4.

When the micro movable device X2 is driven, a reference potential is provided to the electrode part 12 and electrode part 52 of the rocking part 10 in all the micro movable units Xa in common. In this state, a drive potential is provided to each of the electrode parts 51 and 53 of the selected micro movable unit Xa. Accordingly, the rocking part 10 and the frame 20 of each micro movable unit Xa are individually driven to conduct rocking. Therefore, the reflecting direction of light reflected by the mirror surface 11a on the land part 11 of the rocking part 10 in each micro movable unit Xa may be shifted. The provision of a common reference potential to the electrode part 12 and the electrode part 52 of the rocking part 10 in all the micro movable units Xa is realized via the wiring pattern 62C (including the pad part 62a to be an external connection terminal) in the wiring substrate S4, the reinforced fixed part 70C, the pad part 35 bonded to the reinforced fixed part 70C on the micro movable substrate S3 side, the portion 32d of the second layer 32 of the frame 30 in the micro movable substrate S3, the conductive via 34b, the portion 31a of the first layer 31, the connecting part 43, the portion 21c of the first layer 21 of the frame 20, the conductive via 24c, the portion 22a of the second layer 22, the conductive via 24a, the portion 21a of the first layer 21, the connecting part 41, and the beam part 13 of the rocking part 10. The reference potential is, for example, a ground potential and is preferably maintained constant. The provision of a drive potential to the electrode parts 51 and 53 of the selected micro movable unit Xa is realized in the same manner as in the first embodiment.

In the manufacture of the micro movable device X2, the micro movable substrate S3 illustrated in FIG. 26A is prepared by following a procedure similar to that for preparing the micro movable substrate S1 of the micro movable device X1. Also, as illustrated in FIG. 26A, the bump parts 71A to 71D, the conductive adhesive 72' and the substrate fixing adhesive 73' are provided on the pad parts 62b and 63 of the wiring substrate S4 by following a procedure similar to that for manufacturing the micro movable device X1.

Next, as illustrated in FIG. 26B, the micro movable substrate S3 and the wiring substrate S4 are joined by the bump parts 71A to 71D, the conductive adhesive 72' and the substrate fixing adhesive 73'. In this process, the adhesive parts 72 and 73 are formed by heat-hardening the conductive adhesive 72' and the substrate fixing adhesive 73'.

The micro movable device X2 containing the micro movable substrate S3, the wiring substrate S4, and the spacers 70A and 70B, and the reinforced fixed parts 70C and 70D that join the micro movable substrate S3 to the wiring substrate S4 is manufactured according to the method described above.

In the joining process of the micro movable substrate S3 and the wiring substrate S4, as described above with reference to FIGS. 26A-26B, the adhesive part 73 of the reinforced fixed parts 70C and 70D is formed by hardening the substrate fixing adhesive 73'. At this point, a frictional force against contraction of the substrate fixing adhesive 73' is generated at an interface between the hardening substrate fixing adhesive 73' and the bump parts 71C and 71D. The contraction when the substrate fixing adhesive 73' hardens is thereby suppressed. Moreover, if the substrate fixing adhesive 73' contracts when it hardens, a stress acts on a bonding part of a reinforced fixed part in the frame 30 of the micro movable substrate S3. However, the reinforced fixed parts 70C and 70D are bonded to the outermost second area 30B' of the second area 30B, instead of the first area 30A, in the frame 30. Thus, the stress is less likely to be transferred to the connecting parts 42 and 43 in the micro movable device X2. The first area 30A of the frame 30 is an area of the frame 30 facing the movable part in a direction in which the axial center A2 of rotational displacement of the movable part (the rocking part 10, the frame 20, the connecting parts 41, and the electrode parts 51 and 52) extends. The connecting parts 42 and 43 are connected to the first area 30A. The axial center A2 defined by the connecting parts 42 and 43 passes through the first area 30A. In the frame 30, with a decreasing distance from the axial center A2 to a part where a stress acts, the stress is more likely to be transferred to the connecting parts 42 and 43. Thus, the spring constant of the connecting parts 42 and 43 tends to vary. However, the reinforced fixed parts 70C and 70D are bonded to the outermost second area 30B' of the second area 30B, which is farther away from the axial center A2 than the first area 30A. Thus, a stress acting on a bonding part of a reinforced fixed part is less likely to be transferred to the connecting parts 42 and 43. In the micro movable device X2, as described above, the contraction of the substrate fixing adhesive 73' in the joining process of the micro movable substrate S3 and the wiring substrate S4 is suppressed. Further, a stress acting on a bonding part of a reinforced fixed part due to the contraction of the substrate fixing adhesive f 73' is less likely to be transferred to the connecting parts 42 and 43. Therefore, according to the micro movable device X2, variations in the spring constant of the connecting parts 42 and 43 before and after the micro movable substrate S3 and the wiring substrate S4 are joined are suppressed.

In the manufactured micro movable device X2, on the other hand, the volume of the adhesive part 73 of the reinforced fixed parts 70C and 70D is inhibited from being changed by a temperature change. This is because a frictional force against volume change of the adhesive part 73 is generated at an interface between the adhesive part 73 and the bump parts 71C and 71D. If the volume of the adhesive part 73 of the reinforced fixed parts 70C and 70D changes due to a temperature change, a stress acts on a bonding part of a reinforced fixed part in the frame 30. However, as described above, the reinforced fixed parts 70C and 70D are bonded to the outermost second area 30B' of the second area 30B, which is farther away from the axial center A2 than the first area 30A, instead of the first area 30A in the frame 30 of the micro movable substrate S3 or the micro movable unit Xa. Thus, the micro movable device X2 is suitable for inhibiting the stress from being transferred to the connecting parts 42 and 43. Thus, in the micro movable device X2, the volume change of the adhesive part 73 of the reinforced fixed parts 70C and 70D due to a temperature change is suppressed. Further, a stress acting on a bonding part of a reinforced fixed part due to a volume change of the adhesive part 73 is less likely to be transferred to the connecting parts 42 and 43. Therefore, the micro movable device X2 is suitable for suppressing variations in the spring constant of the connecting parts 42 and 43 also after the micro movable substrate S3 and the wiring substrate S4 are joined.

Thus, the micro movable device X2 is suitable for suppressing variations in the spring constant of the connecting parts 42 and 43 that connect the frame 30 and the movable part (the rocking part 10, the frame 20, the connecting parts 41, and the electrode parts 51 and 52) both during and after a manufacturing process. The micro movable device X2 described above is suitable for suppressing variations of mechanical characteristics such as the resonance frequency of the movable part. Therefore, degradation in device performance is suitably suppressed.

In the micro movable device X2, the base material of the micro movable substrate S3 is, as described above, a silicon material. The substrate 61, which is the base material of the wiring substrate S4, is also made of, as described above, a silicon material. Thus, the micro movable device X2 is suitable for making the difference between a volume change of the micro movable substrate S3 and that of the wiring substrate S4 due to a temperature change small. Therefore, the micro movable device X2 is suitable for suppressing a stress generated in a bonding part of a reinforced fixed part in the frame 30.

In the micro movable device X2, in the same manner as described for the micro movable device X1, the reinforced fixed part 70C containing the plurality of the bump parts 71C may be provided. Similarly, the reinforced fixed part 70D containing the plurality of the bump parts 71D may be provided. The spacer 70A containing the plurality of the bump parts 71A may be provided. The spacer 70B containing the plurality of the bump parts 71B may be provided.

The micro movable devices X1 and X2 described above may be applied to an optical switching apparatus.

Figure 27:
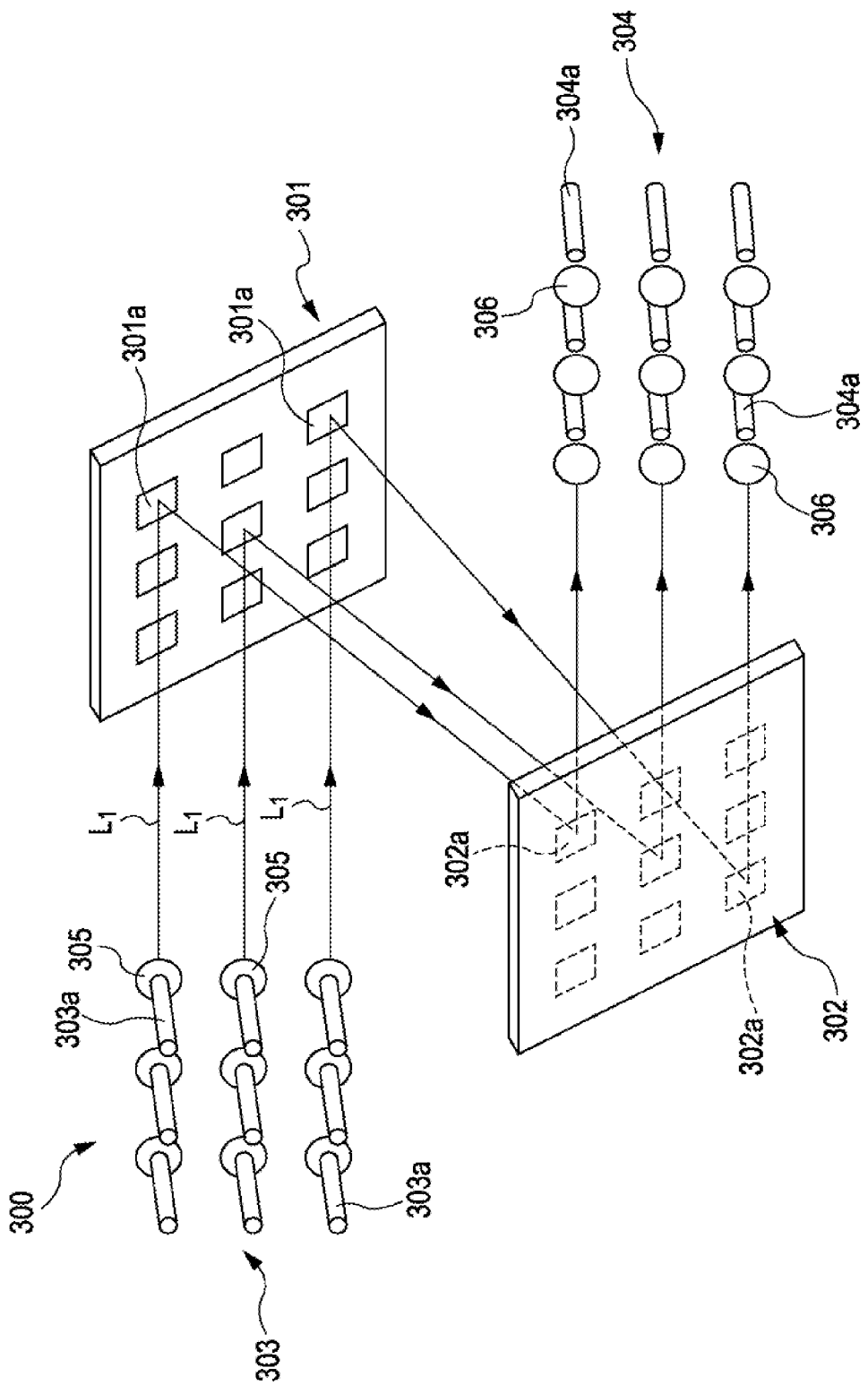
FIG. 27 is a schematic diagram of an optical switching apparatus according to a third embodiment.

FIG. 27 is a schematic diagram of an optical switching apparatus 300 according to the third embodiment. The optical switching apparatus 300 includes a pair of micro mirror arrays 301 and 302, an input fiber array 303, an output fiber array 304, and a plurality of micro lenses 305 and 306. The input fiber array 303 includes a plurality of input fibers 303a. The micro mirror array 301 has a plurality of micro mirrors 301a corresponding to each of the input fibers 303a disposed therein. The output fiber array 304 includes a plurality of output fibers 304a. The micro mirror array 302 has a plurality of micro mirrors 302a corresponding to each of the output fibers 304a disposed therein. Each of the micro mirrors 301a and 302a has a mirror surface to reflect light. The micro mirrors 301a and 302a are configured by the above micro movable device X1 and controls the direction of the mirrors. The micro mirror arrays 301 and 302 may be configured by a plurality of the above micro movable devices X2. The micro lenses 305 are each facing the ends of the input fibers 303a. The micro lenses 306 are each facing the ends of the output fibers 304a.

In the optical switching apparatus 300, light L1 emitted from the input fiber 303a passes through the corresponding micro lens 305. Accordingly, the light L1 is mutually made into parallel lights before traveling toward the micro mirror array 301. The light L1 is reflected by the corresponding micro mirror 301a and deflected to the mirror array 302. At this point, the mirror surface of the micro mirror 301a is oriented in a specific direction so that the light L1 is incident on the desired micro mirror 302a. Next, the light L1 is reflected by the micro mirror 302a and deflected to the output fiber array 304. At this point, the mirror surface of the micro mirror 302a is oriented in a specific direction so that the light L1 is incident on the desired output fiber 304a.

Thus, according to the optical switching apparatus 300, the light L1 emitted from each of the input fibers 303a reaches the desired output fiber 304a through deflection by the micro mirror arrays 301 and 302. That is, the input fiber 303a and the output fiber 304a are connected one-to-one. By changing the deflecting angle in the micro mirrors 301a and 302a, the output fiber 304a reached by the light L1 may be switched.

Characteristics required for an optical switching apparatus include large capacity, high-speed, and high reliability during switching operations. From these viewpoints, a micro mirror device produced by micro machining technology is desirable as a switching device incorporated into an optical switching apparatus. According to the micro mirror device, a switching processing may be performed as a light signal without the light signal being converted into an electric signal between an input-side optical transmission line and an output-side optical transmission line in an optical switching apparatus.

Figure 28:
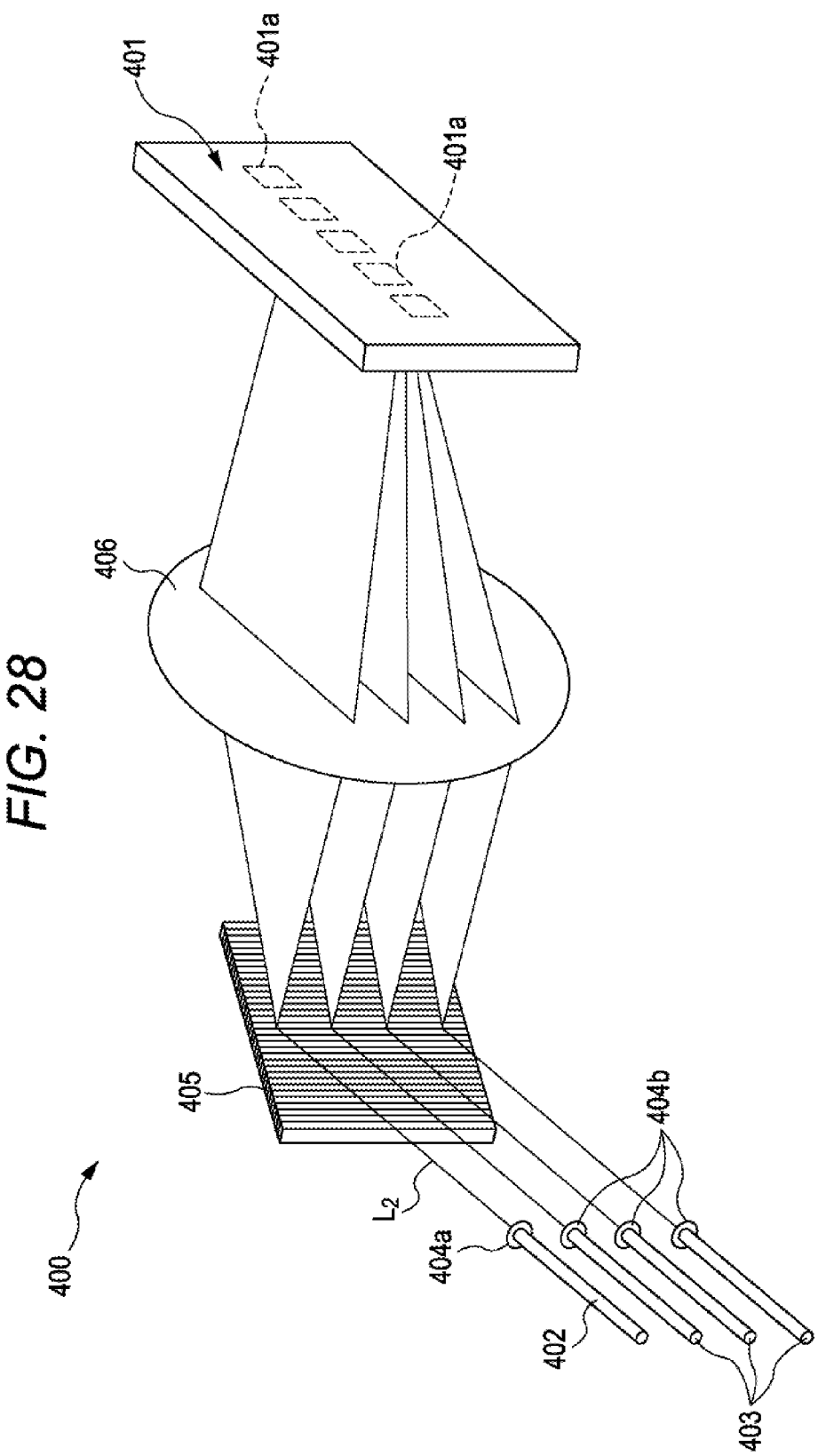
FIG. 28 is a schematic diagram of an optical switching apparatus according to a fourth embodiment.
Figure 29:
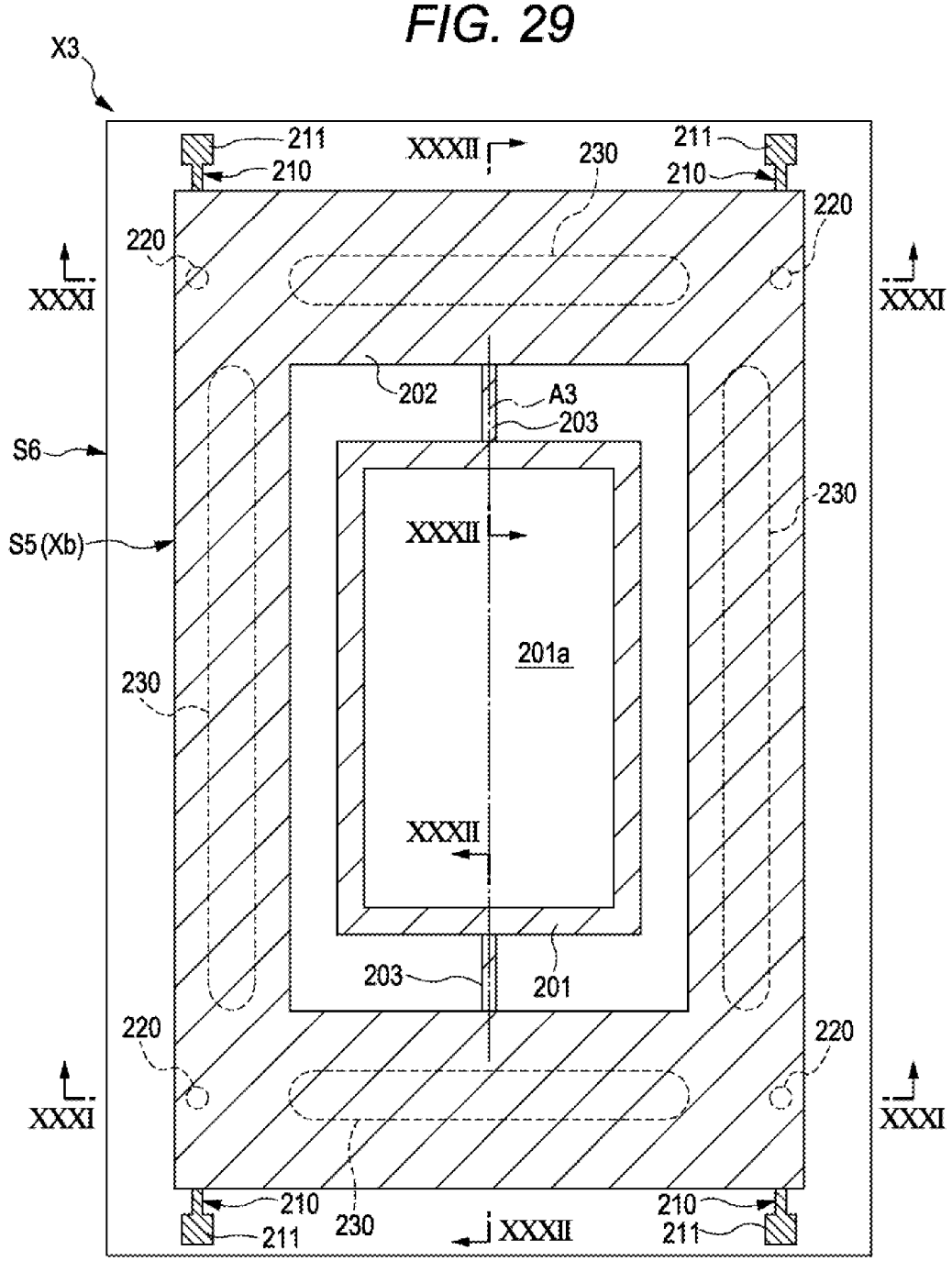
FIG. 29 is a plan view of a conventional micro movable device.
Figure 30:
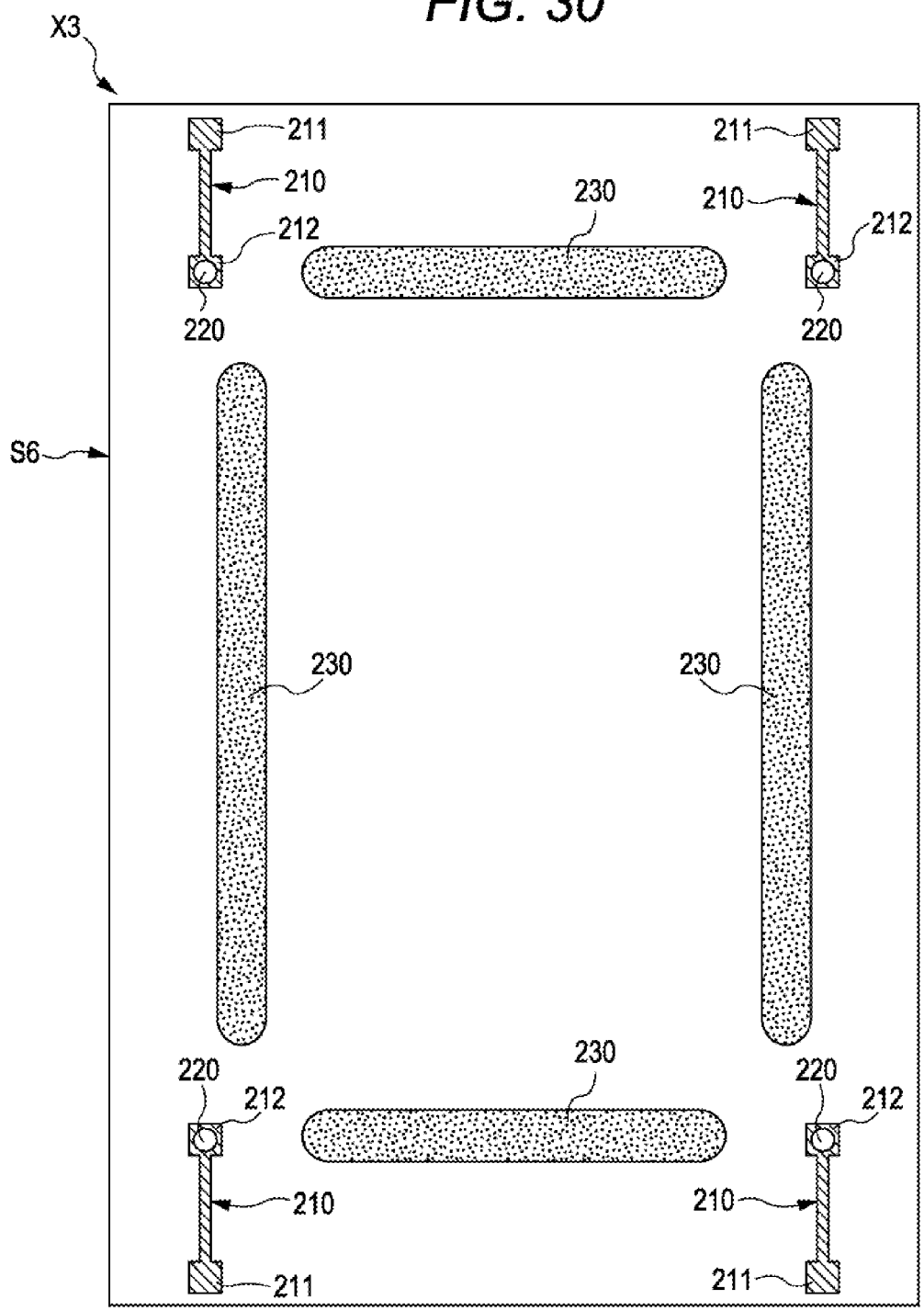
FIG. 30 is a plan view partially illustrating the micro movable device illustrated in FIG. 29.
Figure 31:
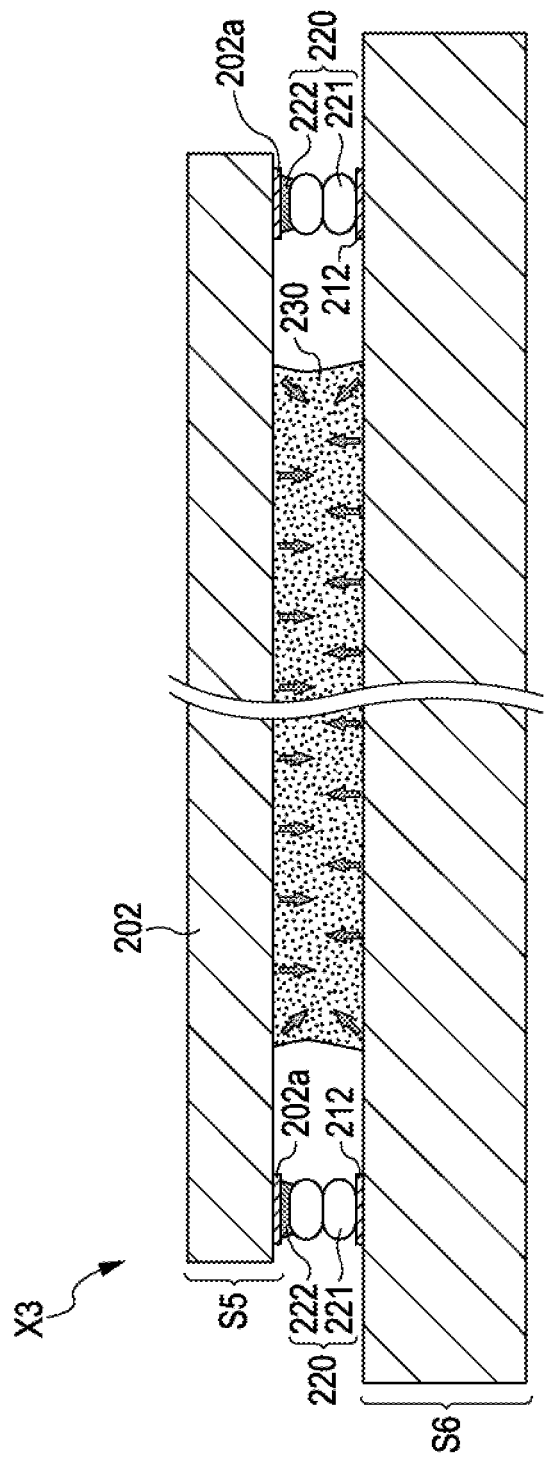
FIG. 31 is a sectional view along a line XXXI-XXXI in FIG. 29.
Figure 32:
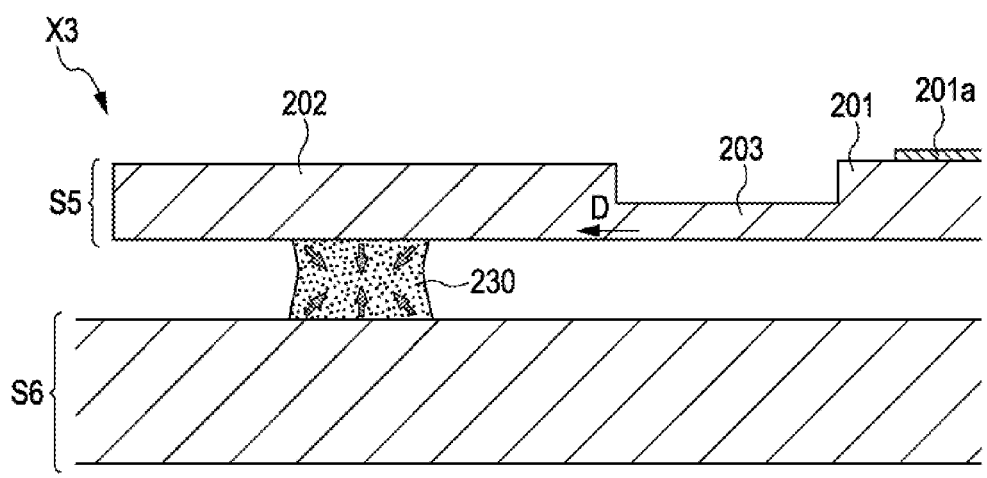
FIG. 32 is a sectional view along a line XXXII-XXXII in FIG. 29.

FIG. 28 is a schematic diagram of a wavelength selective optical switching apparatus 400 according to a fourth embodiment. The optical switching apparatus 400 includes a micro mirror array 401, one input fiber 402, three output fibers 403, a plurality of micro lenses 404a and 404b, a spectroscope 405, and a condenser lens 406. The micro mirror array 401 includes a plurality of micro mirrors 401a. The plurality of micro mirrors 401a is arranged in the micro mirror array 401, for example, in a row. Each of the micro mirrors 401a has a mirror surface to reflect light. Each of the micro mirrors 401a is configured by the above micro movable device X1 and controls the direction of the mirror surface. The micro mirror array 401 may be configured by the above micro movable device X2. The micro lens 404a is facing the end of the input fiber 402. The micro lens 404b is facing the end of the output fiber 403. The spectroscope 405 is a reflection grating whose degree of diffraction of reflected light depends on the wavelength.

In the optical switching apparatus 400, light L2 is emitted from the input fiber 402. The light L2 includes a plurality of wavelengths. The light L2 from the input fiber 402 is made into parallel lights by passing through the micro lens 404a. The light L2 is reflected by the spectroscope 405. At this point, the light L2 is reflected at a different angle for each wavelength. The reflected light passes through the condenser lens 406. At this point, the light L2 is condensed to the corresponding micro mirror 401a in the micro mirror array 401 for each wavelength. The light of each wavelength is reflected in a specific direction by the corresponding micro mirror 401a. At this point, the mirror surface of the micro mirror 401a is oriented in a specific direction so that light of the corresponding wavelength is made to reach the desired output fiber 403. Then, the light reflected by the micro mirror 401a enters the selected specific output fiber 403 via the condenser lens 406, the spectroscope 405, and the micro lens 404b. According to the optical switching apparatus 400, light of the desired wavelength may be selected from the light L2 in this manner.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present inventions have been described in detail, it should be understood that the various changes, substitutions, and alterations could be made hereto without departing from the spirit and scope of the invention.

What is claimed is:

1. A micro movable device comprising:
a micro movable substrate in which a micro movable unit is formed, the micro movable unit including a frame, a movable part, and a coupling part for coupling the frame and the movable part to define an axial center of rotation of the movable part;
a supporting substrate; and
a reinforced fixed part provided between the frame and the supporting substrate, and including a first spacer that joins the frame to the supporting substrate and an adhesive part that covers the first spacer and joins the frame to the supporting substrate, wherein the adhesive part substantially covers the first spacer, and wherein
the frame includes a first area facing the movable part in a direction of extent of the axial center and a second area different from the first area, and
the reinforced fixed part is bonded to the second area of the frame.

2. A micro movable device comprising:
a micro movable substrate in which a plurality of micro movable units are formed, each micro movable unit including a frame, a movable part, and a coupling part for coupling the frame and the movable part to define an axial center of rotation of the movable part, the frames of the plurality of micro movable units forming a common frame;
a supporting substrate; and
a reinforced fixed part provided between the common frame and the supporting substrate, and including a spacer part that joins the common frame to the supporting substrate and an adhesive part that covers the spacer part and joins the common frame to the supporting substrate, wherein the adhesive part substantially covers the spacer part, and wherein
the plurality of micro movable units are arranged in a line so that the axial centers of the plurality of micro movable units run parallel to each other;
the common frame includes a first area facing the movable part in a direction of extent of the axial centers, and a second area different from the first area, and
the reinforced fixed part is bonded to the second area of the common frame.

3. The micro movable device according to claim 2, wherein the second area includes a pair of outermost areas, the plurality of micro movable units are arranged between the pair of outermost areas, and
the reinforced fixed part is bonded to at least one of the outermost areas.

4. The micro movable device according to claim 2, wherein the axial centers of the plurality of micro movable units are parallel to one another.

5. The micro movable device according to claim 1, wherein the supporting substrate is a wiring substrate, and
the first spacer electrically connects the wiring substrate and the micro movable substrate.

6. The micro movable device according to claim 1, further comprising: a second spacer provided between the frame and the supporting substrate to join the frame to the supporting substrate.

7. The micro movable device according to claim 6, wherein the supporting substrate is a wiring substrate, and
the second spacer electrically connects the wiring substrate and the micro movable substrate.

8. The micro movable device according to claim 6, wherein at least one of the first spacer and the second spacer is a bump part including a plurality of bumps stacked on each other.

9. The micro movable device according to claim 8, wherein the bump part is bonded to the micro movable substrate via a conductive adhesive.

10. The micro movable device according to claim 1, wherein the micro movable substrate and the supporting substrate are made of silicon.

11. The micro movable device according to claim 1, wherein the micro movable unit further includes a drive mechanism configured to cause the movable part to be rotationally displaced.

12. The micro movable device according to claim 1, wherein the movable part includes a movable frame, a movable body, and a coupling part for coupling the movable frame and the movable body.

13. An optical switching apparatus including a plurality of micro mirror devices, each micro mirror device comprising:
- a micro movable substrate in which a micro movable unit is formed, the micro movable unit including a frame, a movable part on which a mirror is formed, and a coupling part for coupling the frame and the movable part to define an axial center of rotation of the movable part;
- a supporting substrate; and
- a reinforced fixed part provided between the frame and the supporting substrate, and including a spacer part that joins the frame to the supporting substrate and an adhesive part that covers the spacer part and joins the frame to the supporting substrate; wherein the adhesive part substantially covers the spacer part; and wherein
- the frame includes a first area facing the movable part in a direction of extent of the axial center, and a second area different from the first area, and the reinforced fixed part is bonded to the second area of the frame.

* * * * *